(12) United States Patent
Wallis

(10) Patent No.: US 11,165,395 B2
(45) Date of Patent: *Nov. 2, 2021

(54) APPARATUS AND METHODS FOR OVERLOAD PROTECTION OF RADIO FREQUENCY AMPLIFIERS

(71) Applicant: Skyworks Solutions, Inc., Irvine, CA (US)

(72) Inventor: Leslie Paul Wallis, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/682,529

(22) Filed: Nov. 13, 2019

(65) Prior Publication Data

US 2020/0259467 A1 Aug. 13, 2020

Related U.S. Application Data

(63) Continuation of application No. 15/941,554, filed on Mar. 30, 2018, now Pat. No. 10,511,270.

(Continued)

(51) Int. Cl.
*H03G 3/12* (2006.01)
*H03F 1/52* (2006.01)
(Continued)

(52) U.S. Cl.
CPC ............... *H03F 1/523* (2013.01); *H03F 1/26* (2013.01); *H03F 1/565* (2013.01); *H03F 3/193* (2013.01); *H03F 3/195* (2013.01); *H03F 3/72* (2013.01); *H03F 2200/111* (2013.01); *H03F 2200/222* (2013.01); *H03F 2200/294* (2013.01);

(Continued)

(58) Field of Classification Search
CPC .......... H03F 1/523; H03F 1/565; H03F 3/193; H03F 1/26; H03F 3/195; H03F 3/72; H03F 2203/7236; H03F 2200/111; H03F 2200/222; H03F 2203/7221; H03F 2200/411; H03F 2203/7215; H03F 2203/7209; H03F 2200/444;
(Continued)

(56) References Cited

U.S. PATENT DOCUMENTS 4,859,967 A 8/1989 Swanson
5,847,610 A 12/1998 Fujita
(Continued)

FOREIGN PATENT DOCUMENTS

JP 2008-054260 A 3/2008

*Primary Examiner* — Khanh V Nguyen
*Assistant Examiner* — Khiem D Nguyen
(74) *Attorney, Agent, or Firm* — Knobbe, Martens, Olson & Bear, LLP

(57) ABSTRACT

Radio frequency amplifiers with overload protection are provided herein. In certain configurations, an RF amplifier system includes an RF amplifier that receives an RF signal from an input terminal and that generates an amplified RF signal at an output terminal, and an overload detection circuit that generates a detection signal indicating a detected signal level of the RF amplifier. The RF amplifier includes an amplification device that amplifies the RF signal and a degeneration circuit that provides degeneration to the amplification device. Additionally, the detection signal is operable to control an amount of degeneration provided by the degeneration circuit so as to protect the RF amplifier from overload.

20 Claims, 18 Drawing Sheets

Related U.S. Application Data

(60) Provisional application No. 62/484,073, filed on Apr. 11, 2017.

(51) Int. Cl.
 *H03F 3/193* (2006.01)
 *H03F 1/26* (2006.01)
 *H03F 3/195* (2006.01)
 *H03F 3/72* (2006.01)
 *H03F 1/56* (2006.01)

(52) U.S. Cl.
 CPC .. *H03F 2200/372* (2013.01); *H03F 2200/411* (2013.01); *H03F 2200/444* (2013.01); *H03F 2200/451* (2013.01); *H03F 2203/7209* (2013.01); *H03F 2203/7215* (2013.01); *H03F 2203/7221* (2013.01); *H03F 2203/7236* (2013.01)

(58) Field of Classification Search
 CPC ......... H03F 2200/372; H03F 2200/451; H03F 2200/294
 USPC ......................................... 330/298, 296, 285
 See application file for complete search history.

(56) References Cited

U.S. PATENT DOCUMENTS

| | | |
|---|---|---|
| 6,188,277 B1 | 2/2001 | Borodulin et al. |
| 6,744,310 B2 | 6/2004 | Honda |
| 7,348,854 B1 | 3/2008 | Mordkovich |
| 7,515,000 B1 | 4/2009 | Jin et al. |
| 8,000,068 B2 | 8/2011 | Brown, Jr. et al. |
| 8,362,840 B2 | 1/2013 | Andrys et al. |
| 8,610,503 B2 | 12/2013 | Kaczman et al. |
| 9,595,926 B2 | 3/2017 | Quaglietta |
| 10,084,416 B2 | 9/2018 | Wallis |
| 10,211,795 B2 | 2/2019 | Wallis |
| 10,511,270 B2 | 12/2019 | Wallis |
| 2008/0239597 A1 | 10/2008 | Van Bezooijen et al. |
| 2011/0291765 A1 | 12/2011 | Sun et al. |
| 2011/0292554 A1 | 12/2011 | Yao et al. |
| 2016/0094192 A1 | 3/2016 | Khesbak et al. |
| 2017/0279415 A1 | 9/2017 | Wallis |
| 2018/0026592 A1 | 1/2018 | Wallis |
| 2019/0007002 A1 | 1/2019 | Wallis |

APPARATUS AND METHODS FOR OVERLOAD PROTECTION OF RADIO FREQUENCY AMPLIFIERS

CROSS-REFERENCE TO RELATED APPLICATIONS

This application is a continuation of U.S. application Ser. No. 15/941,554, filed Mar. 30, 2018 and titled "APPARATUS AND METHODS FOR OVERLOAD PROTECTION OF RADIO FREQUENCY AMPLIFIERS," which claims the benefit of priority under 35 U.S.C. § 119 of U.S. Provisional Patent Application No. 62/484,073, filed Apr. 11, 2017 and titled "APPARATUS AND METHODS FOR OVERLOAD PROTECTION OF RADIO FREQUENCY AMPLIFIERS," each of which is herein incorporated by reference in its entirety.

BACKGROUND

Field

Embodiments of the invention relate to electronic systems, and in particular, to radio frequency (RF) electronics.

Description of Related Technology

An RF amplifier is used to boost or amplify an RF signal. Thereafter, the amplified RF signal can be used for a variety of purposes, including, for example, driving a switch, a mixer and/or a filter in an RF communication system. RF amplifiers can amplify signals of a wide range of frequencies, for instance, signals in a frequency range of about 30 kHz to 300 GHz, such as in the range of about 450 MHz to about 6 GHz for certain communications standards.

One example of an RF amplifier is a low noise amplifier (LNA), which can be used to amplify a relatively weak RF signal received over an antenna.

SUMMARY

In certain embodiments, the present disclosure relates to a radio frequency amplifier system. The radio frequency amplifier system includes an input terminal configured to receive a radio frequency signal, an output terminal, a radio frequency amplifier configured to receive the radio frequency signal from the input terminal and to generate an amplified radio frequency signal at the output terminal, and an overload detection circuit configured to generate a detection signal indicating a detected signal level of the radio frequency amplifier. The radio frequency amplifier includes an amplification device configured to amplify the radio frequency signal and a degeneration circuit configured to provide degeneration to the amplification device. The detection signal is operable to control an amount of degeneration provided by the degeneration circuit so as to protect the radio frequency amplifier from overload.

In various embodiments, the radio frequency amplifier system further includes an electrostatic discharge protection circuit electrically coupled to the input terminal and configured to protect the radio frequency amplifier from an electrostatic discharge event, and the overload detection circuit is integrated with the electrostatic discharge protection circuit. According to a number of embodiments, the overload detection circuit is configured to generate the detection signal based on an internal signal level of the electrostatic discharge protection circuit. In accordance with several embodiments, the electrostatic discharge protection circuit includes a plurality of diodes in series, and the overload detection circuit is configured to generate the detection signal based on a voltage across one or more of the plurality of diodes. According to several embodiments, the overload detection circuit includes a reference current source configured to generate a reference current, and the overload detection circuit is configured to generate the detection signal based on an amount of the reference current steered to the electrostatic discharge protection circuit.

In some embodiments, the radio frequency amplifier is a low noise amplifier.

In several embodiments, the amplification device includes a bipolar transistor, and the degeneration circuit configured to provide emitter degeneration to the bipolar transistor.

In various embodiments, the amplification device includes a field-effect transistor, the degeneration circuit configured to provide source degeneration to the field-effect transistor.

In a number of embodiments, the degeneration circuit includes an inductor, and the detection signal is operable to control an amount of degeneration inductance provided by the degeneration circuit.

In several embodiments, the degeneration circuit includes a resistor, and the detection signal is operable to control an amount of degeneration resistance provided by the degeneration circuit.

In a number of embodiments, the detection signal is operable to increase the amount of degeneration provided by the degeneration circuit in response to the overload detection circuit detecting overload.

In various embodiments, the degeneration circuit includes a switch and a control buffer configured to control the switch based on the detection signal. In accordance with several embodiments, the control buffer is powered in part by the detection signal. According to some embodiments, the control buffer is configured to receive a digital control signal configured to control the switch.

In certain embodiments, the present disclosure relates to a packaged module. The package module includes a packaging substrate and a semiconductor die attached to the packaging substrate. The semiconductor die includes an input terminal and a radio frequency amplifier configured to receive a radio frequency signal from the input terminal. The radio frequency amplifier includes an amplification device configured to amplify the radio frequency signal and a degeneration circuit configured to provide degeneration to the amplification device. The semiconductor die further includes an overload detection circuit configured to generate a detection signal indicating a detected signal level of the radio frequency amplifier, and the detection signal is operable to control an amount of degeneration provided by the degeneration circuit so as to protect the radio frequency amplifier from overload.

In several embodiments, the integrated circuit further includes an electrostatic discharge protection circuit electrically coupled to the input terminal and configured to provide protection against an electrostatic discharge event, and the overload detection circuit is integrated with the electrostatic discharge protection circuit. According to a number of embodiments, the overload detection circuit is configured to generate the detection signal based on an internal signal level of the electrostatic discharge protection circuit. In accordance with some embodiments, the electrostatic discharge protection circuit includes a plurality of diodes in series, and the overload detection circuit is configured to generate the detection signal based on a voltage across one or more of the plurality of diodes. According to various embodiments, the overload detection circuit includes a reference current source configured to generate a reference current, and the overload detection circuit is configured to generate the detection signal based on an amount of the reference current steered to the electrostatic discharge protection circuit.

In some embodiments, the radio frequency amplifier is a low noise amplifier.

In various embodiments, the amplification device includes a bipolar transistor, and the degeneration circuit configured to provide emitter degeneration to the bipolar transistor.

In a number of embodiments, the degeneration circuit includes a switch and a control buffer configured to control the switch based on the detection signal. In accordance with several embodiments, the control buffer is powered in part by the detection signal. According to various embodiments, the control buffer is configured to receive a digital control signal configured to control the switch.

In some embodiments, the amplification device includes a field-effect transistor, and the degeneration circuit configured to provide source degeneration to the field-effect transistor.

In various embodiments, the degeneration circuit includes an inductor, and the detection signal is operable to control an amount of degeneration inductance provided by the degeneration circuit.

In a number of embodiments, the degeneration circuit includes a resistor, and the detection signal operable to control an amount of degeneration resistance provided by the degeneration circuit.

In several embodiments, the detection signal is operable to increase the amount of degeneration provided by the degeneration circuit in response to the overload detection circuit detecting an overload condition of the radio frequency amplifier.

In certain embodiments, the present disclosure relates to a method of overload protection in a radio frequency amplifier system. The method includes receiving a radio frequency signal at an input terminal of a radio frequency amplifier, amplifying the radio frequency signal using an amplification device of the radio frequency amplifier, providing degeneration to the amplification device using a degeneration circuit of the radio frequency amplifier, generating a detection signal indicated a detected signal level of the radio frequency amplifier using an overload detection circuit, and protecting the radio frequency amplifier from overload by controlling an amount of degeneration provided by the degeneration circuit based on the detection signal.

In some embodiments, the method further includes providing electrostatic discharge protection to the input terminal using an electrostatic discharge protection circuit, and generating the detection signal based on an internal signal level of the electrostatic discharge protection circuit.

In several embodiments, the method further includes increasing the amount of degeneration using the detection signal in response to determining that the detected signal level indicates overload.

In a number of embodiments, providing degeneration to the amplification device includes providing emitter degeneration to a bipolar transistor.

In various embodiments, providing degeneration to the amplification device includes providing source degeneration to a field-effect transistor.

In some embodiments, providing degeneration to the amplification device includes providing inductive degeneration using an inductor.

In several embodiments, providing degeneration to the amplification device includes providing resistive degeneration using a resistor.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
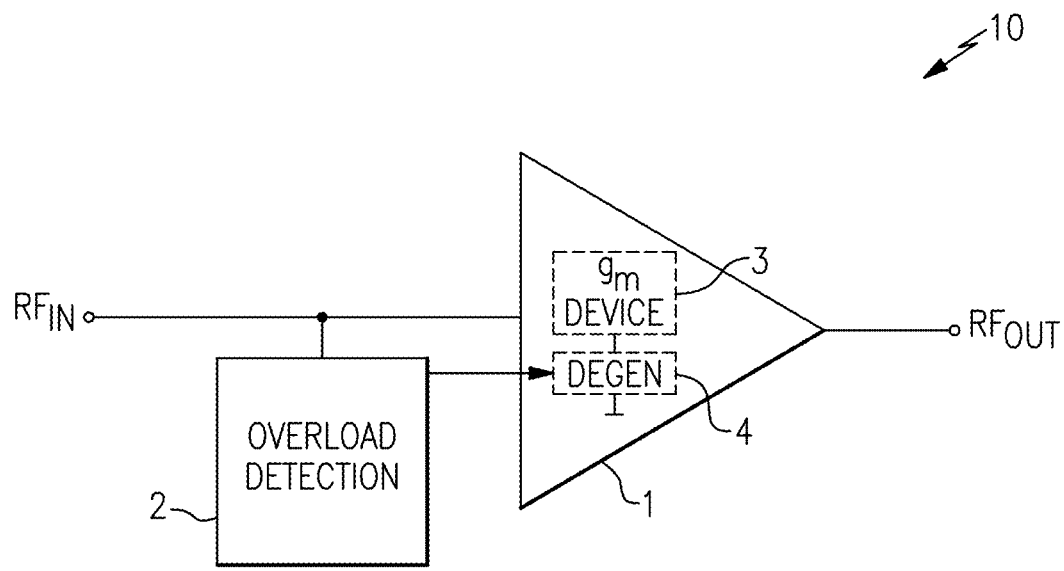
FIG. 1 is a schematic diagram of a radio frequency (RF) amplifier system according to one embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Absent an overdrive protection scheme, providing a large input signal to an RF amplifier can result in high current and/or voltage manifesting in circuitry of the RF amplifier, such as amplification transistors. Such high current and/or voltage can cause permanent electrical overstress damage to the amplification transistors such that they are inoperable or that their operation is impaired.

There is a need for improved RF amplifier systems, such as low noise amplifier (LNA) systems, in which amplification transistors are protected from overdrive conditions arising from large input signals.

Apparatus and methods for overload protection of RF amplifiers are provided herein. In certain configurations, an RF amplifier system includes an RF amplifier that receives an RF signal from an input terminal and that generates an amplified RF signal at an output terminal, and an overload detection circuit that generates a detection signal indicating a detected signal level of the RF amplifier. The RF amplifier includes an amplification device that amplifies the RF signal and a degeneration circuit that provides degeneration to the amplification device. Additionally, the detection signal is operable to control an amount of degeneration provided by the degeneration circuit so as to protect the RF amplifier from overload.

The overload protection schemes herein can be used to limit large current and/or voltage swing conditions manifesting within circuitry of an RF amplifier, such as an LNA.

In certain implementations, the overload detection circuit adjusts an amount of degeneration provided by the degeneration circuit from a first degeneration amount to a second degeneration amount in response to detecting an overload condition. However, the teachings herein are applicable to overload detection circuits implemented in a wide variety of ways, including, but not limited to, overload detection circuits that control the amount of degeneration between two or more discrete levels as well as overload detection circuits that provide analog adjustment to the amount of degeneration.

The overload protection schemes disclosed herein are applicable to a wide variety of RF communication systems, including, but not limited to, smartphones, base stations, handsets, wearable electronics, and/or tablets.

FIG. 1 is a schematic diagram of an RF amplifier system 10 according to one embodiment. The RF amplifier system 10 includes an input terminal $RF_{IN}$, an output terminal $RF_{OUT}$, an RF amplifier 1, and an overload detection circuit 2. As shown in FIG. 1, the overload detection circuit 2 includes an amplification or transconductance ($g_m$) device 3 and a degeneration circuit 4.

Although the RF amplifier system 10 of FIG. 1 illustrates one implementation of an RF amplifier system with overload protection, the teachings herein are applicable to RF amplifier systems implemented in a wide variety of ways.

During operation of the RF amplifier system 10, the RF amplifier 1 receives an RF signal from the input terminal $RF_{IN}$. Additionally, the amplification device 3 amplifies the RF input signal to generate an amplified RF signal at the output terminal $RF_{OUT}$. In one embodiment, the RF amplifier 1 is an LNA, and the RF signal corresponds to a signal received from an antenna.

Although, the RF amplifier 1 is illustrated as including a single amplification device, the teachings herein are applicable to configurations using multiple transistors. In one example, an RF amplifier includes an amplification device, such as a common emitter transistor or common source transistor, and a cascode device, such as a common base transistor or common gate transistor. Furthermore, although the RF amplifier 1 is illustrated as including a single stage, the teachings herein are applicable to multi-stage amplifiers.

The amplification device 3 can be implemented in a variety of ways. In one example, the amplification device 3 is implemented as a common emitter transistor. In another example, the amplification device 3 is implemented as a common source transistor. The RF amplifier 1 can include one or more bipolar transistors, one or more field-effect transistors (FETs), or a combination thereof.

As shown in FIG. 1, the amplification device 3 is electrically connected in series with the degeneration circuit 4. In certain implementations, the amplification device 3 and the degeneration circuit 4 are electrically connected in series between the output terminal $RF_{OUT}$ and a DC voltage, such as ground.

The degeneration circuit 4 can be implemented in a wide variety of ways, such as by using resistors and/or inductors. In one example, the amplification device 3 is implemented as a bipolar transistor, and the degeneration circuit 4 provides emitter degeneration to the bipolar transistor. In another example, the amplification device 3 is implemented as a FET, and the degeneration circuit 4 provides source degeneration to the FET.

Including the degeneration circuit 4 provides a number of advantages. For example, the degeneration circuit 4 can improve input impedance matching, enhance stability, and/or increase the RF amplifier's linearity.

In the illustrated embodiment, the overload detection circuit 2 is electrically coupled to the input terminal $RF_{IN}$. Additionally, the overload detection circuit 2 generates a detection signal indicating a detected signal level of the RF amplifier 1. The overload detection circuit 2 provides the detection signal to the degeneration circuit 4, and the detection signal operates to control an amount of degeneration provided by the degeneration circuit 4 to protect the RF amplifier 1 from overload.

In certain implementations, in response to detecting an overload condition, the overload detection circuit 2 increases the impedance of the degeneration circuit 4. By increasing the amount of degradation impedance, the bias of the amplification device 3 is cut off and/or a gain of the amplification device 3 is reduced.

Figure 2:
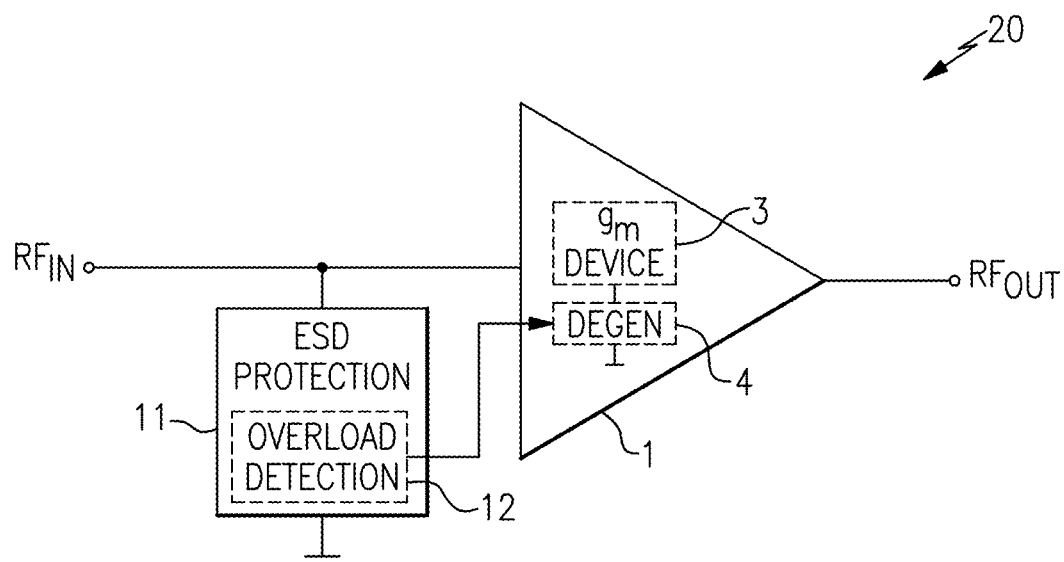
FIG. 2 is a schematic diagram of an RF amplifier system according to another embodiment.

FIG. 2 is a schematic diagram of an RF amplifier system 20 according to another embodiment. The RF amplifier system 20 includes an input terminal $RF_{IN}$, an output terminal $RF_{OUT}$, an RF amplifier 1, and an electrostatic discharge (ESD) protection circuit 11 that includes an overload detection circuit 12.

The RF amplifier system 20 of FIG. 2 is similar to the RF amplifier system 10 of FIG. 1, except that the RF amplifier system 20 of FIG. 2 includes an overload detection circuit that is integrated as part of an ESD protection circuit.

ESD events can arise from a variety of sources, such as external charge sources, supply switching, and/or electromagnetic pulses, and are associated with high levels of power and/or charge. An ESD event can cause charge build-up in an integrated circuit (IC), leading to high voltage and/or current levels beyond which the IC can reliably tolerate. Absent a protection mechanism, the ESD event can lead to IC damage, such as gate oxide rupture, junction breakdown, and/or metal damage.

An IC's robustness to ESD events can be evaluated in a wide variety of ways. For example, specifications for ESD compliance can be set by various organizations, such as the International Electrotechnical Commission (IEC) and/or Joint Electronic Device Engineering Council (JEDEC). For instance, a human body model (HBM) test can be used to evaluate the IC's performance with respect to ESD events arising from the sudden release of electrostatic charge from a person to an IC. An IC's performance with respect to such specifications can be an important performance metric by which the IC is evaluated.

In the illustrated embodiment, the overload detection circuit 12 is integrated with the ESD protection circuit 11. Accordingly, devices used for providing ESD protection, such as diodes, silicon-controlled rectifiers, and/or transistors are also used in part for detecting the signal level of the RF amplifier 1.

Integrating the overload detection circuit 12 with the ESD protection circuit 11 can provide a number of advantages. For example, implementing an overload detection circuit 12 in this manner can reduce component count, size, cost, and/or an amount of parasitic loading of the input terminal $RF_{IN}$ relative to an implementation including a separate ESD protection circuit and a separate overload detection circuit.

Figure 3A:
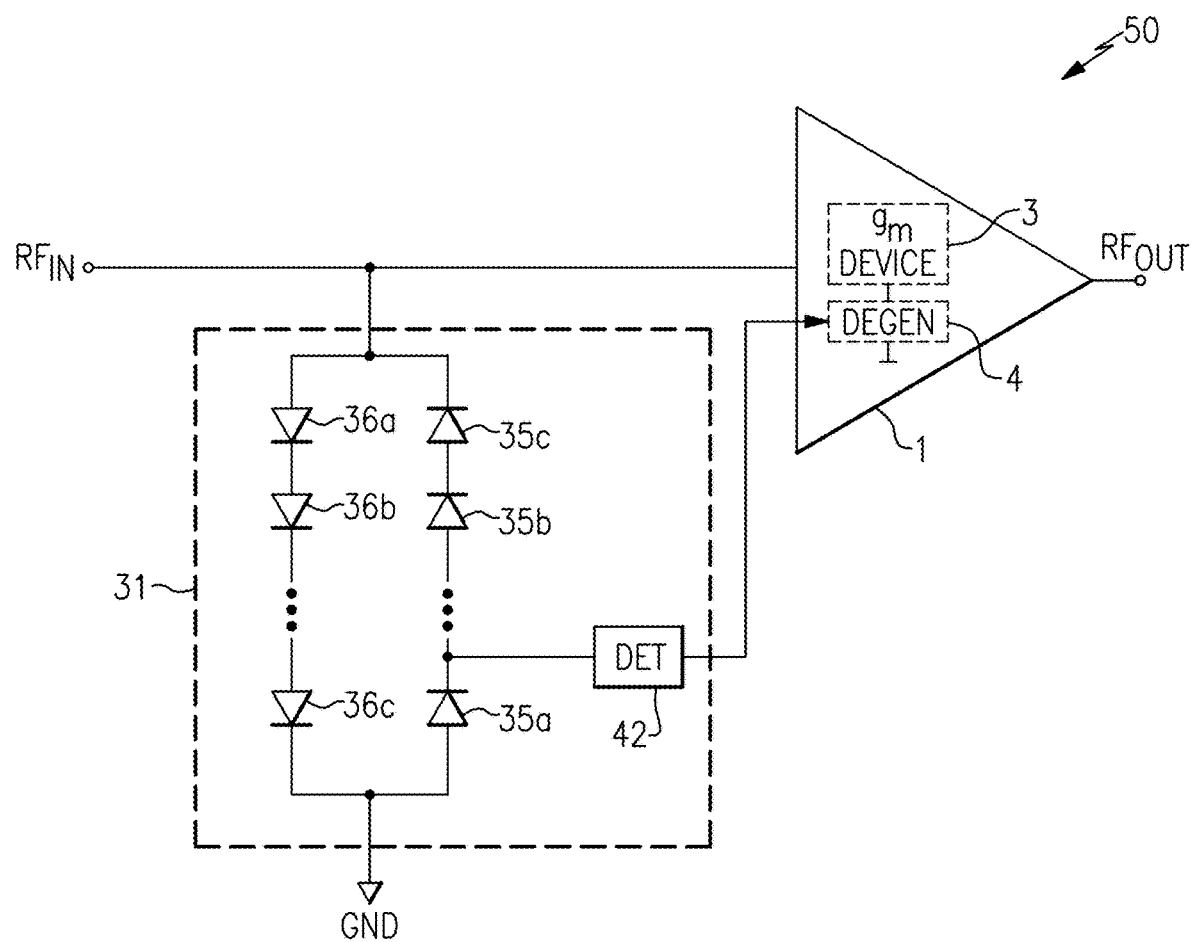
FIG. 3A is a schematic diagram of an RF amplifier system according to another embodiment.

FIG. 3A is a schematic diagram of an RF amplifier system 50 according to another embodiment. The RF amplifier system 50 includes an input terminal $RF_{IN}$, an output terminal $RF_{OUT}$, an RF amplifier 1, and an ESD protection circuit 31.

The RF amplifier system 50 of FIG. 3A is similar to the RF amplifier system 20 of FIG. 2, except that the RF amplifier system 50 of FIG. 3A illustrates a specific implementation of an ESD protection circuit with integrated overload detection.

For example, the illustrated ESD protection circuit 31 includes a first string or series combination of diodes 35a-35c and a second string of diodes 36a-36c. In the illustrated embodiment, the first string of diodes 35a-35c includes three diodes connected in series from anode to cathode between ground (GND) and the input terminal $RF_{IN}$. Additionally, the second string of diodes 36a-36c includes three diodes connected in series from anode to cathode between the input terminal $RF_{IN}$ and ground.

The first string of diodes 35a-35c provides protection against a negative polarity ESD event that causes a voltage of the input terminal $RF_{IN}$ to decrease below ground. Additionally, a number of and/or a forward voltage of the diodes 35a-35c can control a trigger voltage at which the first string of diodes 35a-35c conducts. Although an example with three diodes is shown, ESD protection can be provided using more or fewer diodes and/or using other types of ESD protection devices.

The second string of diodes 36a-36c provides protection against a positive polarity ESD event that causes a voltage of the input terminal $RF_{IN}$ to increase above ground. Additionally, a number of and/or a forward voltage of the diodes 36a-36c can control a trigger voltage at which the second string of diodes 36a-36c conducts. Although an example with three diodes is shown, ESD protection can be provided using more or fewer diodes and/or using other types of ESD protection devices.

In the illustrated embodiment, the ESD protection circuit 31 further includes a detector 42 that generates a detection signal based on an internal signal level of the ESD protection circuit. For example, in this embodiment, the detector 42 controls the detection signal based on a voltage across the ESD protection diode 35a.

Although one embodiment of an ESD protection circuit with integrated overload detection is shown in FIG. 3A, other implementations are possible. For example, an ESD protection circuit with integrated overload detection can be implemented in a wide variety of ways. In another embodiment, a detector controls a detection signal based on a voltage of an ESD protection transistor. In yet another embodiment, a detector controls a detection signal based on a voltage of a silicon controlled rectifier.

Integrating an overload detection circuit as part of an ESD protection circuit can provide a number of advantages. For example, implementing an overload detection circuit in this manner can reduce component count, size, cost, and/or an amount of parasitic loading of the input terminal $RF_{IN}$ relatively to an implementation including a separate ESD protection circuit and overload detection circuit.

Figure 3B:
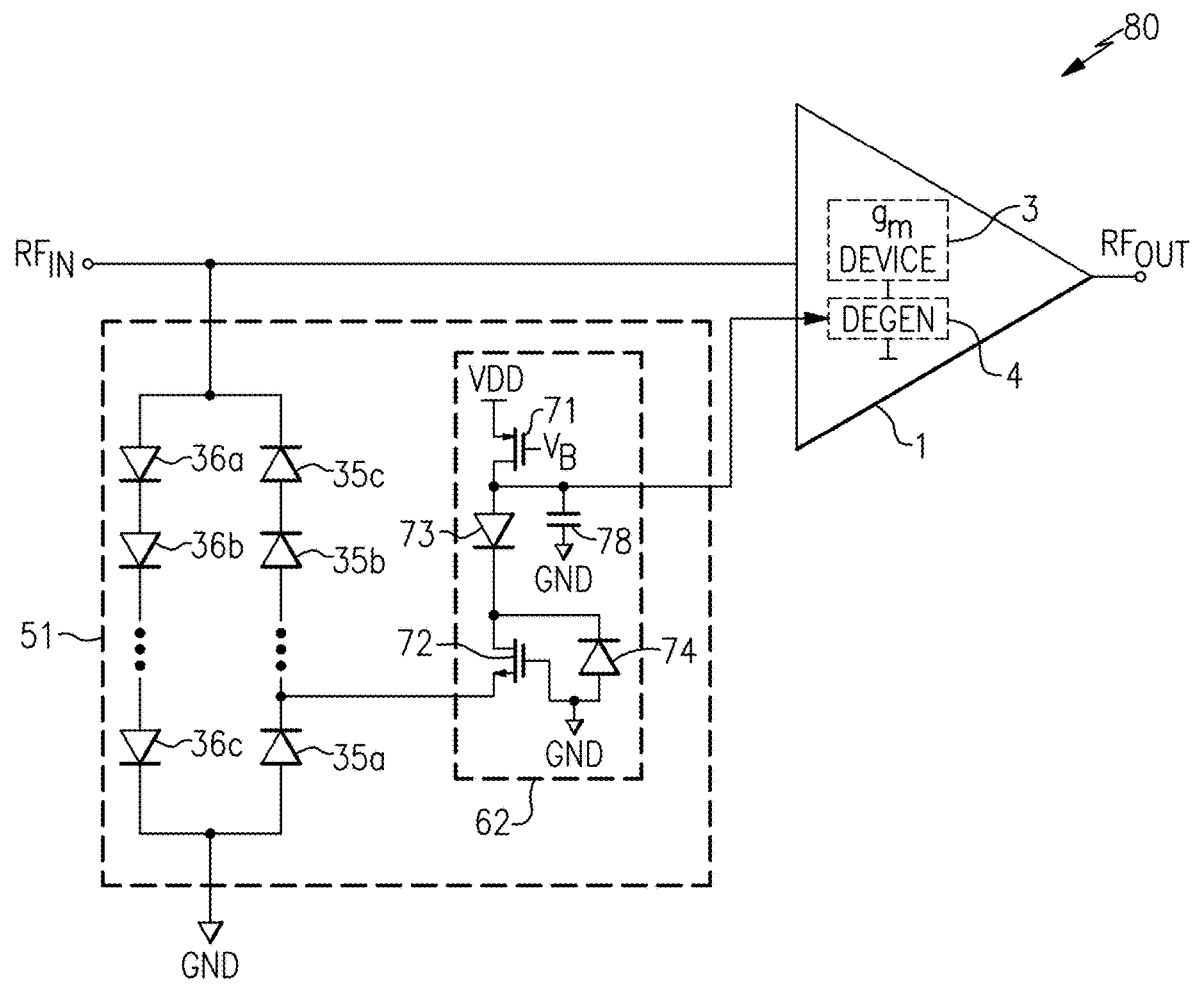
FIG. 3B is a schematic diagram of an RF amplifier system according to another embodiment.

FIG. 3B is a schematic diagram of an RF amplifier system 80 according to another embodiment. The RF amplifier system 80 includes an input terminal $RF_{IN}$, an output terminal $RF_{OUT}$, an RF amplifier 1, and an ESD protection circuit 51. The ESD protection circuit 51 includes a first string of diodes 35a-35c, a second string of diodes 36a-36c, and a detector 62.

The RF amplifier system 80 of FIG. 3B is similar to the RF amplifier system 50 of FIG. 3A, except that the RF amplifier system 80 illustrates a specific implementation of the detector 42 of FIG. 3A.

For example, the detector 62 of FIG. 3B includes a reference current source (implemented in this embodiment as a PFET 71 with a gate bias voltage $V_B$), an NFET 72, a first diode 73, a second diode 74, and a capacitor 78.

When an overload condition is not present at the input terminal $RF_{IN}$, a voltage across the ESD protection diode 35a is relatively small (for example, about 0 V), and the PFET 71 controls the detection signal to a high level (for example, about VDD). However, when an overload condition is present at the input terminal $RF_{IN}$, the voltage across the ESD protection diode 35a is sufficient to turn on the NFET 72. Additionally, activation of the NFET 72 results in a greater current flowing through the NFET 72 relative to the PFET 71, thereby pulling the detection signal to a low level. Accordingly, in this embodiment, a high value of the detection signal indicates no overload being present, and a low value of the detection signal indicates overload. However, other implementations are possible.

Although one implementation of an ESD protection circuit with an integrated overload detection circuit is shown in FIG. 3B, other implementations are possible. For example, an ESD protection circuit with integrated overload detection circuit can be implemented in a wide variety of ways.

Figure 3C:
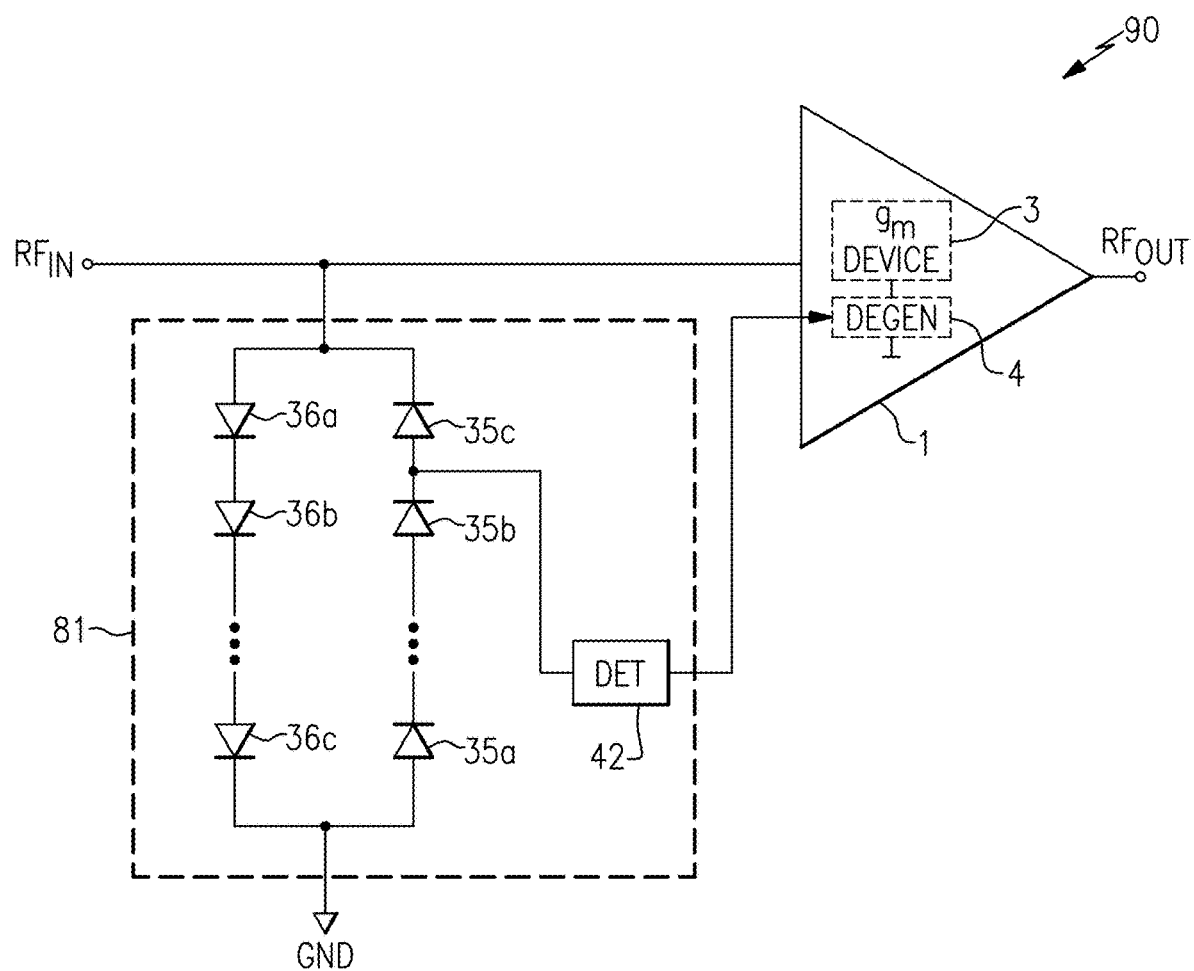
FIG. 3C is a schematic diagram of an RF amplifier system according to another embodiment.

FIG. 3C is a schematic diagram of an RF amplifier system 90 according to another embodiment. The RF amplifier system 90 includes an input terminal $RF_{IN}$, an output terminal $RF_{OUT}$, an RF amplifier 1, and an ESD protection circuit 81.

The RF amplifier system 90 of FIG. 3C is similar to the RF amplifier system 50 of FIG. 3A, except that the RF amplifier system 90 illustrates an implementation in which the input of detector 42 is coupled to a cathode of the second diode 35b, rather than to the cathode of the first diode 35a.

The RF amplifier system 90 illustrates another example of detecting for overload based on monitoring an internal signal level of the ESD protection circuit. However, other implementations are possible.

Figure 3D:
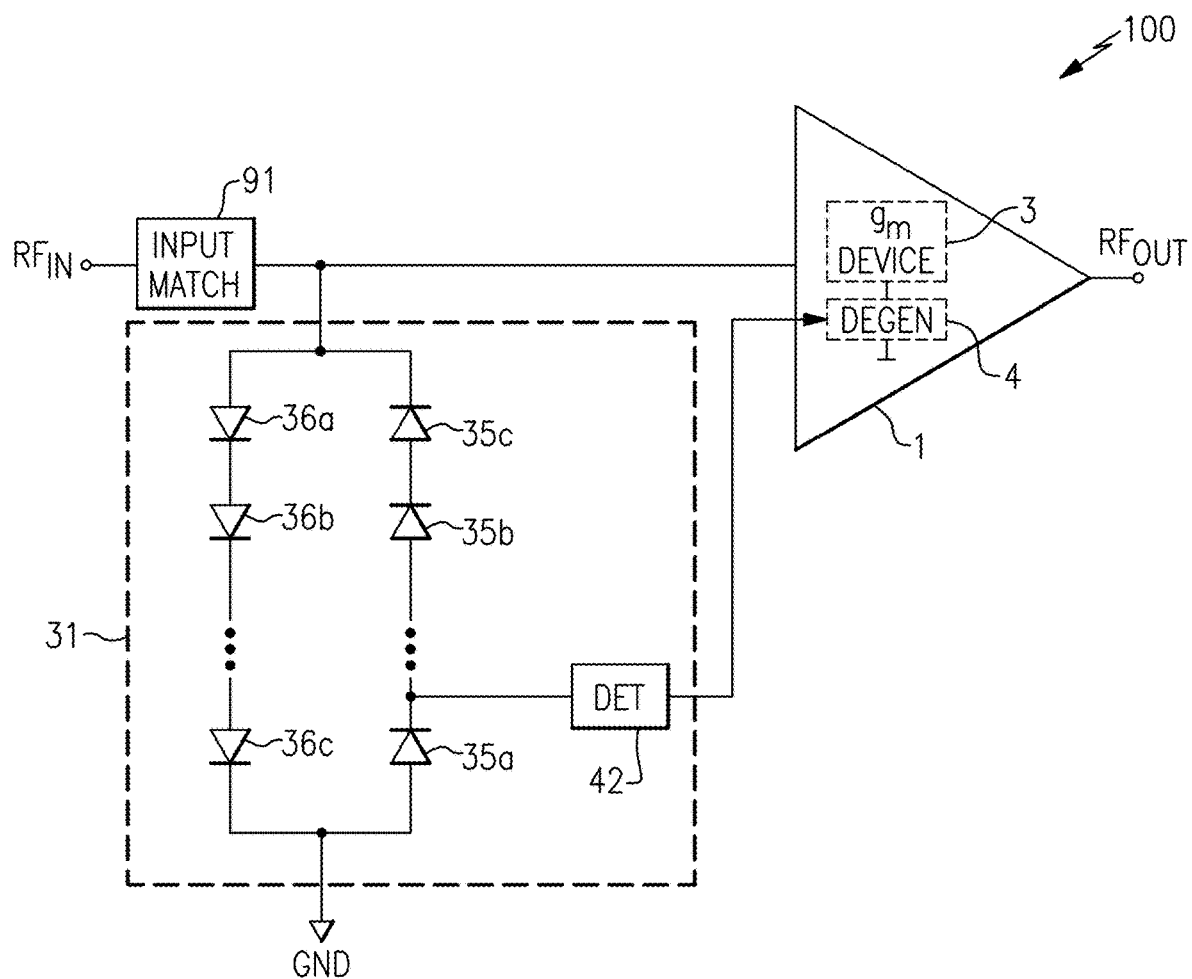
FIG. 3D is a schematic diagram of an RF amplifier system according to another embodiment.

FIG. 3D is a schematic diagram of an RF amplifier system 100 according to another embodiment. The RF amplifier system 100 includes an input terminal $RF_{IN}$, an output terminal $RF_{OUT}$, an RF amplifier 1, an ESD protection circuit 31, and an input matching circuit 91.

The RF amplifier system 100 of FIG. 3D is similar to the RF amplifier system 50 of FIG. 3A, except that the RF amplifier system 100 further includes the input matching circuit 91.

During operation of the RF amplifier 1, a voltage gain is provided across the input matching circuit 91. The voltage gain aids the detector 42 in generating a detection signal indicative of overload. Accordingly, including the input matching circuit 91 enhances the performance of the detector 42.

Figure 3E:
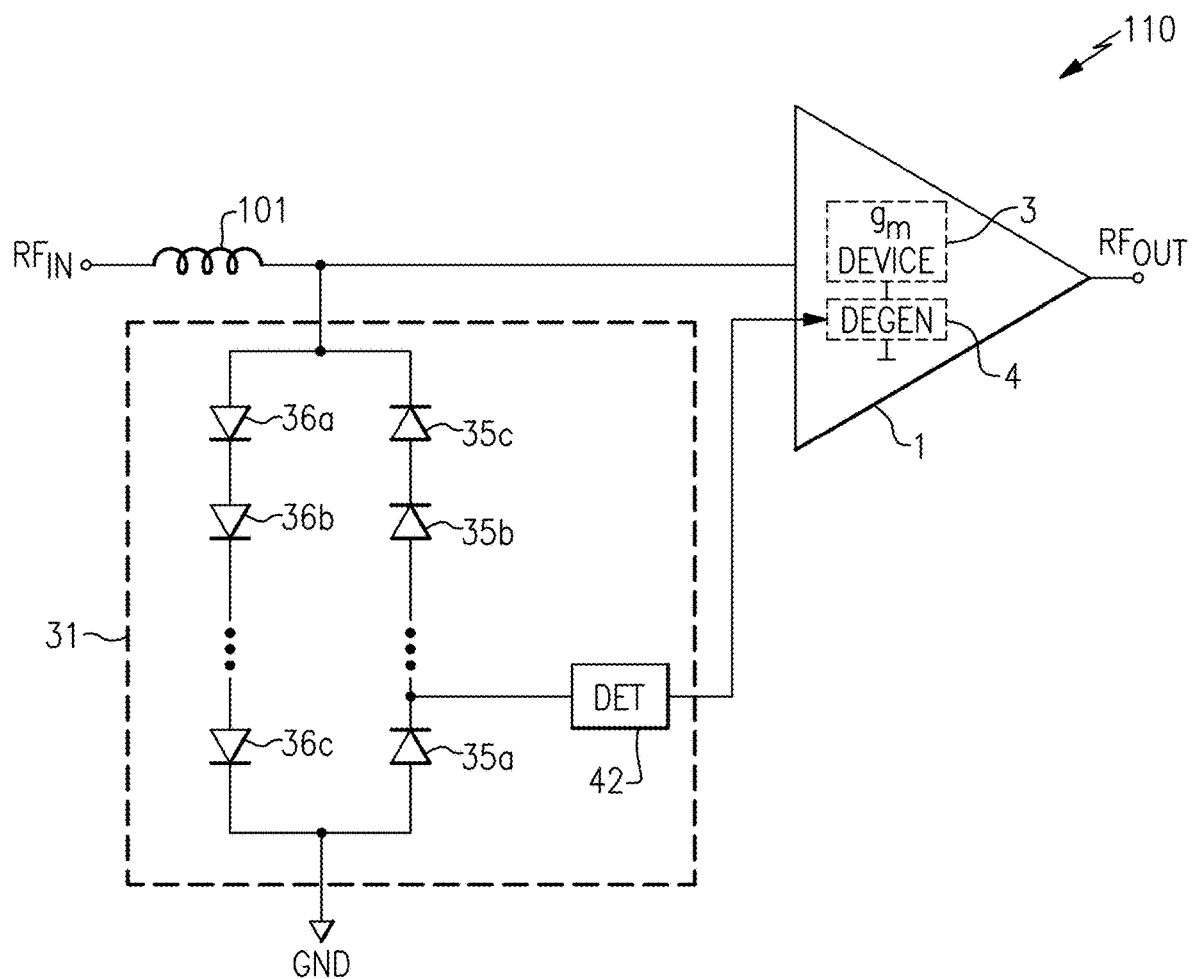
FIG. 3E is a schematic diagram of an RF amplifier system according to another embodiment.

FIG. 3E is a schematic diagram of an RF amplifier system 110 according to another embodiment. The RF amplifier system 110 includes an input terminal $RF_{IN}$, an output terminal $RF_{OUT}$, an RF amplifier 1, an ESD protection circuit 31, and an input matching inductor 101.

The RF amplifier system 110 of FIG. 3E is similar to the RF amplifier system 100 of FIG. 3D, except that the RF amplifier system 110 of FIG. 3E illustrates a specific implementation of an input matching circuit. In particular, the RF amplifier system 110 of FIG. 3E includes the input matching inductor 101.

When an overload condition is received at the input terminal $RF_{IN}$, a voltage gain is provided across the input matching inductor 101, thereby reducing a delay of the detector 42 in generating a detection signal indicating presence of overload. Decreasing the delay of the detector 42 in turn results in faster adjustment of the degeneration circuit 4 and a corresponding enhancement in protection against damage from overload.

Figure 4:
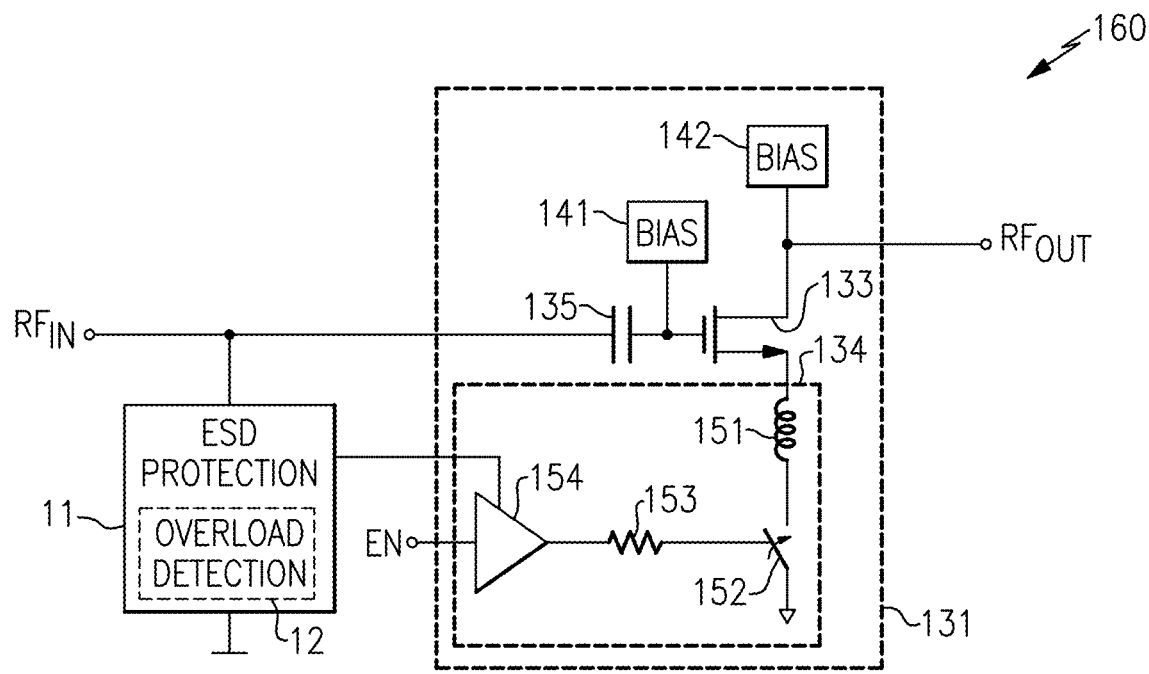
FIG. 4 is a schematic diagram of an RF amplifier system according to another embodiment.

FIG. 4 is a schematic diagram of an RF amplifier system 160 according to another embodiment. The RF amplifier system 160 includes an input terminal $RF_{IN}$, an output terminal $RF_{OUT}$, an RF amplifier 131, and an ESD protection circuit 11 that includes an overload detection circuit 12.

The RF amplifier system 160 of FIG. 4 is similar to the RF amplifier system 20 of FIG. 2, except that the RF amplifier system 160 illustrates a specific implementation of an RF amplifier.

For example, the RF amplifier 131 of FIG. 4 includes an amplification FET 133, an input DC blocking capacitor 135, an input bias circuit 141, an output bias circuit 142, and a degeneration circuit 134. The degeneration circuit 134 includes a degeneration inductor 151, a switch 152 (for instance, a FET switch), a resistor 153, and a control buffer 154. Although one embodiment of an RF amplifier and degeneration circuit is shown in FIG. 4, the teachings herein are applicable to RF amplifiers and degeneration circuits implemented in a wide variety of ways.

In the illustrated embodiment, the control buffer 154 includes an input that receives a digital enable signal EN and a power supply input that receives the detector signal from the overload detection circuit 12 of the ESD protection circuit 11. Additionally, the output of the control buffer 154 is provided to the switch 152 via the resistor 153.

The signal values of the detection signal and the digital enable signal control activation of the switch 152, thereby controlling an amount of degeneration provided by the degeneration circuit 134.

The degeneration circuit 134 of FIG. 4 includes the control buffer 154, which aids in providing digital control over enabling the RF amplifier 131 while also aiding the overload detection circuit 12 in controlling an amount of degeneration provided by the degeneration circuit 134. In certain implementations, the detection signal is used at least in part to power the control buffer 154. Thus, in this embodiment when the detection signal goes low to indicate overload, the output of the control buffer 154 is controlled to turn off the switch 152 and increase the amount of degeneration provided by the degeneration circuit 134.

Including the control buffer 154 can increase signal swing range, enhance a speed at which the detection signal can adjust degeneration, and/or enhance flexibility by also providing control over the amount of degeneration via one or more digital control signals. However, other implementations are possible.

Although the RF amplifier 131 of FIG. 4 is implemented using inductive degeneration, the teachings herein are also applicable to RF amplifiers using resistive degeneration, or a combination of inductive and resistive degeneration.

Figure 5:
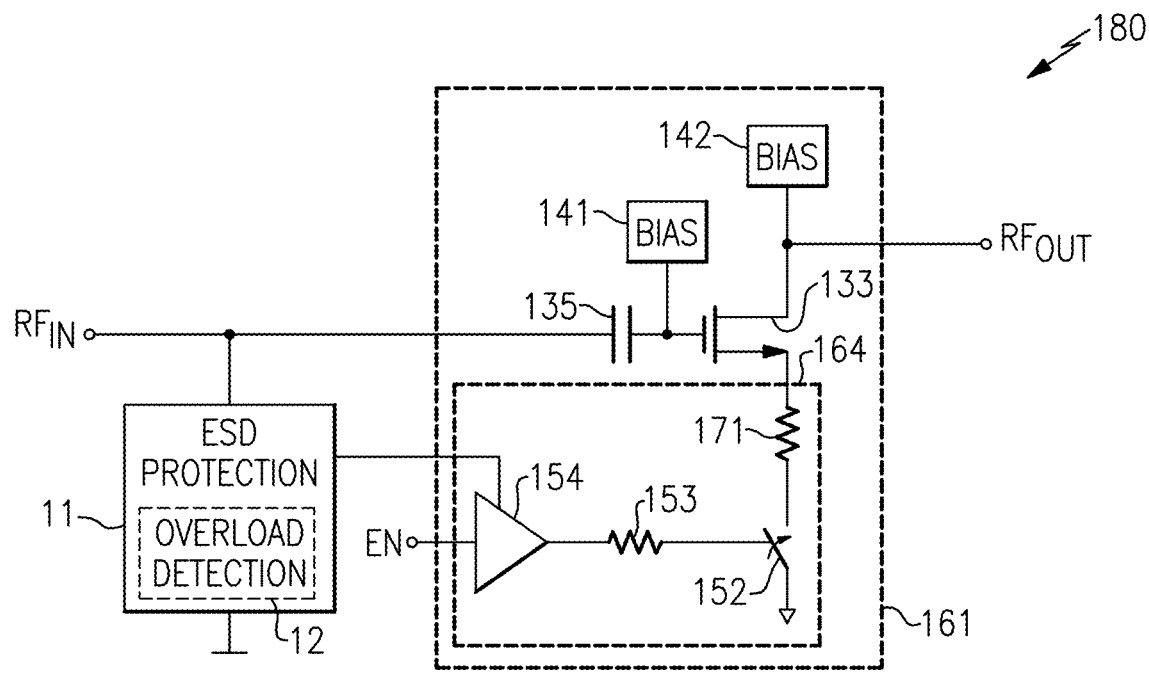
FIG. 5 is a schematic diagram of an RF amplifier system according to another embodiment.

FIG. 5 is a schematic diagram of an RF amplifier system 180 according to another embodiment. The RF amplifier system 180 includes an input terminal $RF_{IN}$, an output terminal $RF_{OUT}$, an RF amplifier 161, and an ESD protection circuit 11 that includes an overload detection circuit 12. The RF amplifier 161 includes an amplification FET 133, an input DC blocking capacitor 135, an input bias circuit 141, an output bias circuit 142, and a degeneration circuit 164 that includes a degeneration resistor 171, a switch 152, a resistor 153, and a control buffer 154.

The RF amplifier system 180 of FIG. 5 is similar to the RF amplifier system 160 of FIG. 4, except that the RF amplifier system 180 illustrates an implementation using resistive degeneration rather inductive degeneration.

Figure 6:
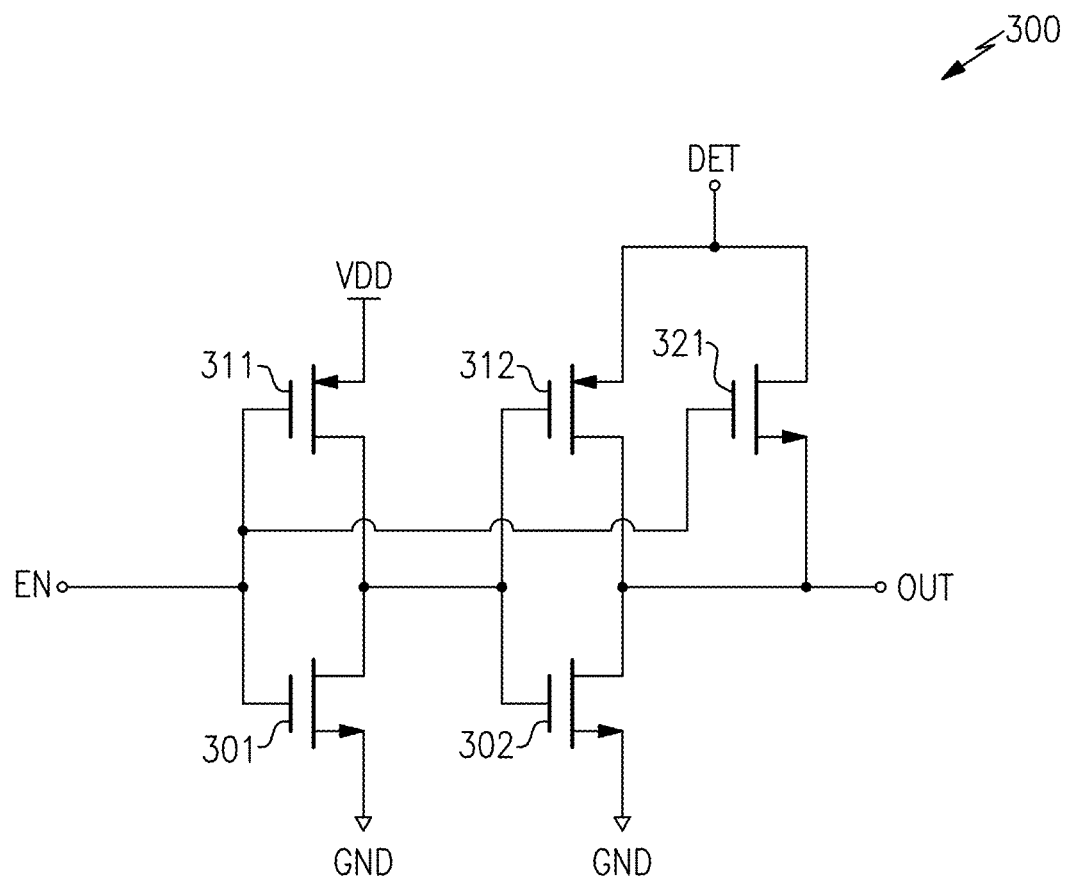
FIG. 6 is a schematic diagram of one embodiment of a control buffer for a degeneration circuit.

FIG. 6 is a schematic diagram of one embodiment of a control buffer 300 for a degeneration circuit. The control buffer 300 includes a first inverter NFET 301, a first inverter PFET 311, a second inverter NFET 302, a second inverter PFET 312, and a feedback NFET 321.

The control buffer 300 includes a first inverter (also referred to herein as a digital inverter circuit) associated with the first inverter NFET 301 and the first inverter PFET 311, and a second inverter associated with the second inverter NFET 302 and the second inverter PFET 312. The first inverter is powered by a supply voltage VDD, and the second inverter is powered by the detection signal DET.

In the illustrated embodiment, a high level of the detection signal DET indicates no overload, and a low level of the detection signal DET indicates overload. Thus, during normal operation of an RF amplifier when no overload is present, the output OUT of the control buffer 300 is controlled based on a state of the digital enable signal EN. However, when an overload condition is present, the detection signal DET is pulled low, and the output OUT is controlled low regardless of the state of the digital enable signal EN.

The illustrated control buffer 300 also includes the feedback NFET 321, which serves to provide hysteresis, thereby enhancing stability of the output OUT.

Although one embodiment of a control buffer is shown in FIG. 6, the teachings herein are applicable to degeneration circuits including control buffers implemented in other ways as well as to implementations of degeneration circuits omitting a control buffer.

Figure 7A:
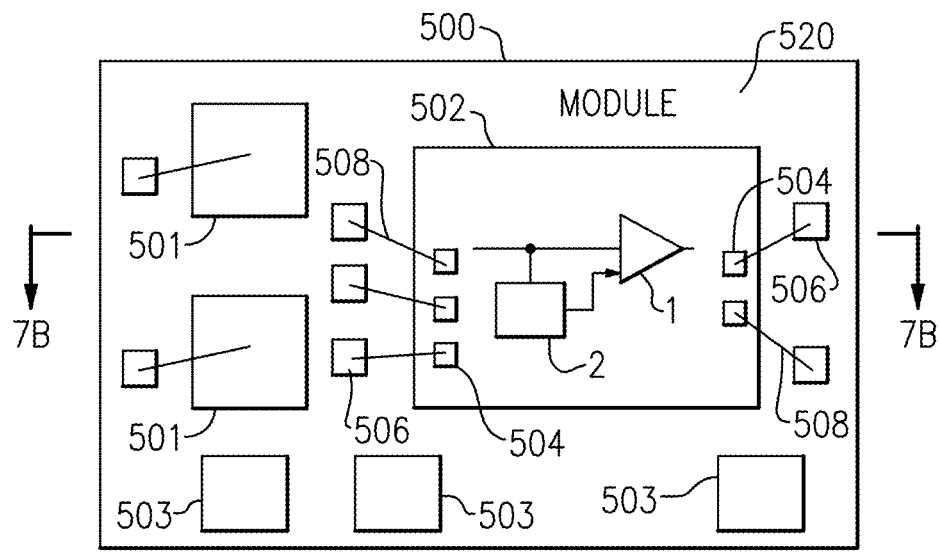
FIG. 7A is a schematic diagram of one embodiment of a packaged module.
Figure 7B:
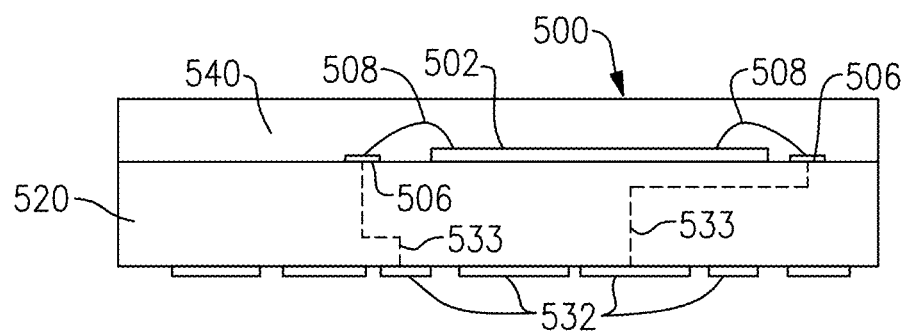
FIG. 7B is a schematic diagram of a cross-section of the packaged module of FIG. 7A taken along the lines 7B-7B.

FIG. 7A is a schematic diagram of one embodiment of a packaged module 500. FIG. 7B is a schematic diagram of a cross-section of the packaged module 500 of FIG. 7A taken along the lines 7B-7B.

The packaged module 500 includes radio frequency components 501, a semiconductor die 502, surface mount devices 503, wirebonds 508, a package substrate 520, and encapsulation structure 540. The package substrate 520 includes pads 506 formed from conductors disposed therein. Additionally, the semiconductor die 502 includes pins or pads 504, and the wirebonds 508 have been used to connect the pads 504 of the die 502 to the pads 506 of the package substrate 520.

The semiconductor die 502 includes an RF amplifier 1 and an overload detection circuit 2. The RF amplifier 1 includes an amplification device that amplifies an RF signal and a degeneration circuit that provides degeneration to the amplification device. Additionally, the detection circuit 2 generates a detection signal that is operable to control an amount of degeneration provided by the degeneration circuit so as to protect the RF amplifier 1 from overload. In certain implementations, the RF amplifier 1 is an LNA.

The packaging substrate 520 can be configured to receive a plurality of components such as the semiconductor die 502 and the surface mount devices 503, which can include, for example, surface mount capacitors and/or inductors. In one implementation, the radio frequency components 501 include integrated passive devices (IPDs).

As shown in FIG. 7B, the packaged module 500 is shown to include a plurality of contact pads 532 disposed on the side of the packaged module 500 opposite the side used to mount the semiconductor die 502. Configuring the packaged module 500 in this manner can aid in connecting the packaged module 500 to a circuit board, such as a phone board of a wireless device. The example contact pads 532 can be configured to provide radio frequency signals, bias signals, and/or power (for example, a power supply voltage and ground) to the semiconductor die 502 and/or the surface mount devices 503. As shown in FIG. 7B, the electrical connections between the contact pads 532 and the semiconductor die 502 can be facilitated by connections 533 through the package substrate 520. The connections 533 can represent electrical paths formed through the package substrate 520, such as connections associated with vias and conductors of a multilayer laminated package substrate.

In some embodiments, the packaged module 500 can also include one or more packaging structures to, for example, provide protection and/or facilitate handling. Such a packaging structure can include overmold or encapsulation structure 540 formed over the packaging substrate 520 and the components and die(s) disposed thereon.

It will be understood that although the packaged module 500 is described in the context of electrical connections based on wirebonds, one or more features of the present disclosure can also be implemented in other packaging configurations, including, for example, flip-chip configurations.

An RF front end system can include circuits in a signal path between an antennas and a baseband system. Some RF front ends can include circuits in signal paths between one or more antennas and a mixer configured to modulate a signal to RF or to demodulate an RF signal.

Figure 8A:
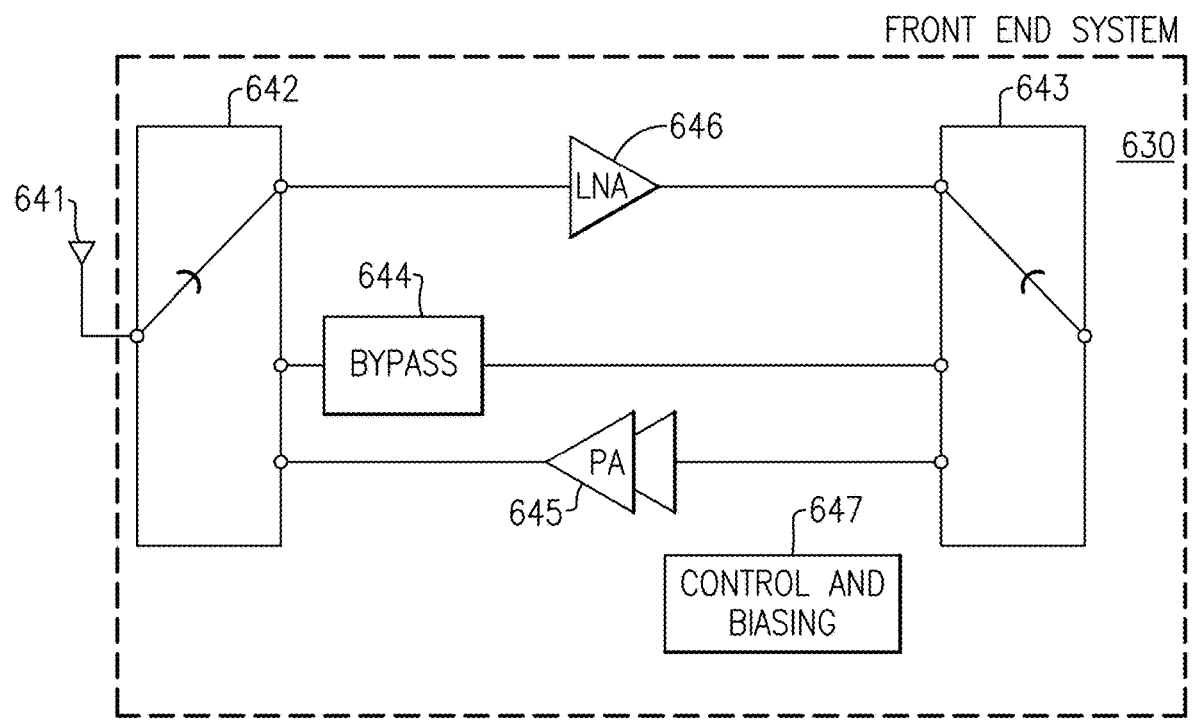
FIG. 8A is a schematic diagram of a front end system according to one embodiment.

FIG. 8A is a schematic diagram of a front end system 630 according to one embodiment.

The RF front end system 630 is configured to receive RF signals from an antenna 641 and to transmit RF signals by way of the antenna 641. The illustrated front end system 630 includes a first multi-throw switch 642, a second multi-throw switch 643, a receive signal path that includes an LNA 646, a bypass network 644, and a transmit signal path that includes a power amplifier 645. The RF front end system 630 can include one or more RF amplifiers implemented in accordance with the teachings herein. For instance, in one example, the LNA 646 is implemented in accordance with any of the principles and advantages discussed herein.

The bypass network 644 can include any suitable network for matching and/or bypassing the receive signal path and the transmit signal path. The bypass network 644 can be implemented by a passive impedance network or by a conductive trace or wire. The power amplifier 645 can be implemented in a wide variety of ways.

The first multi-throw switch 642 can selectively connect a particular signal path to the antenna 641. The first multi-throw switch 642 can electrically connect the receive signal path to the antenna 641 in a first state, electrically connect the bypass signal path to the antenna 641 in a second state, and electrically connect the transmit signal path to the antenna 641 in a third state.

The second multi-throw switch 643 can selectively connect a particular signal path to an input/output port of the front end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front end system 630.

The control and biasing circuit 647 can be used to control and bias circuitry of the RF front end system 630, including, but not limited to, the LNA 646, the first multi-throw switch 641, and/or the second multi-throw switch 643.

Figure 8B:
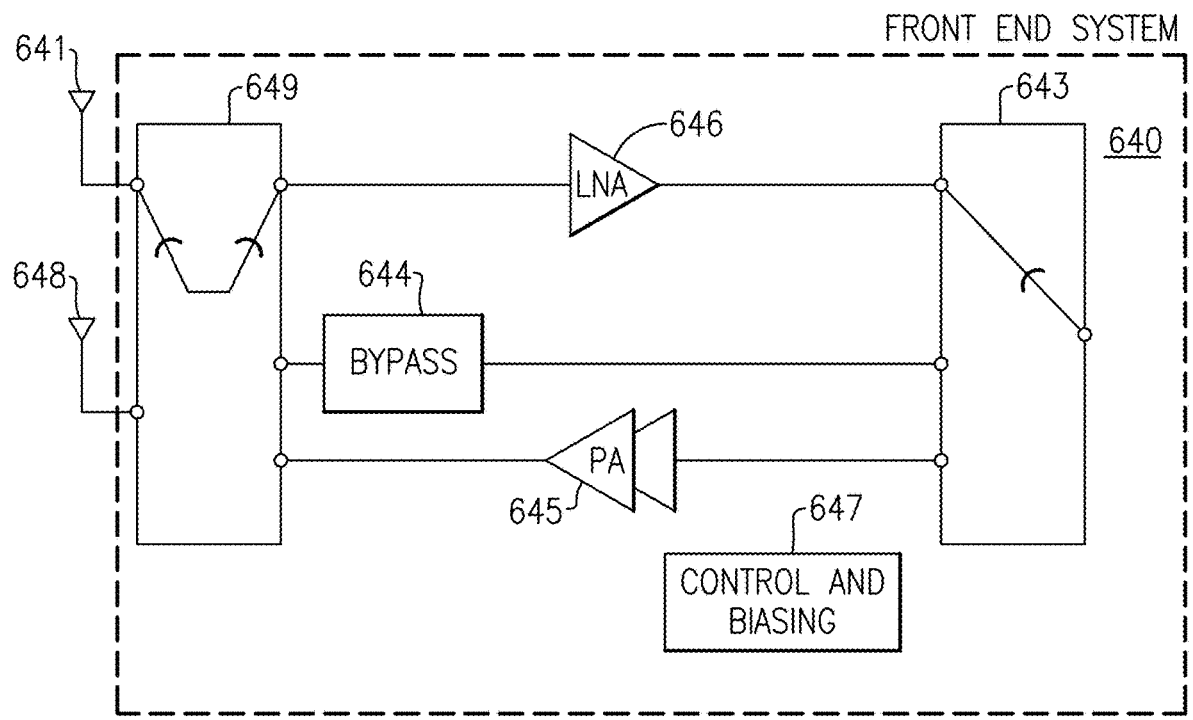
FIG. 8B is a schematic diagram of a front end system according to another embodiment.

FIG. 8B is a schematic diagram of a front end system 640 according to another embodiment.

The RF front end system 640 of FIG. 8B is similar to the RF front end system 630 of FIG. 8A, except that the first multi-throw switch 649 is configured to selectively connect a particular signal path to either a first antenna 641 or a second antenna 648. The multi-throw switch 649 can be a multi-throw, multi-pole switch.

The front end systems of FIGS. 8A and/or 8B can be implemented in a packaged module. Such packaged modules can include relatively low cost laminate-based front end modules that combine low noise amplifiers with power amplifiers and/or switch functions. Some such packaged modules can be multi-chip modules. In certain implementations, some or the all of the illustrated components in any of the front end systems in FIGS. 8A and/or 8B can be embodied on a single integrated circuit or die. Such a die can be manufactured using any suitable process technology. As one example, the die can be a semiconductor-on-insulator die, such as a silicon-on-insulator (SOI) die. According to some implementations, one or more antennas can be integrated with any of the front end systems discussed herein.

Figure 9A:
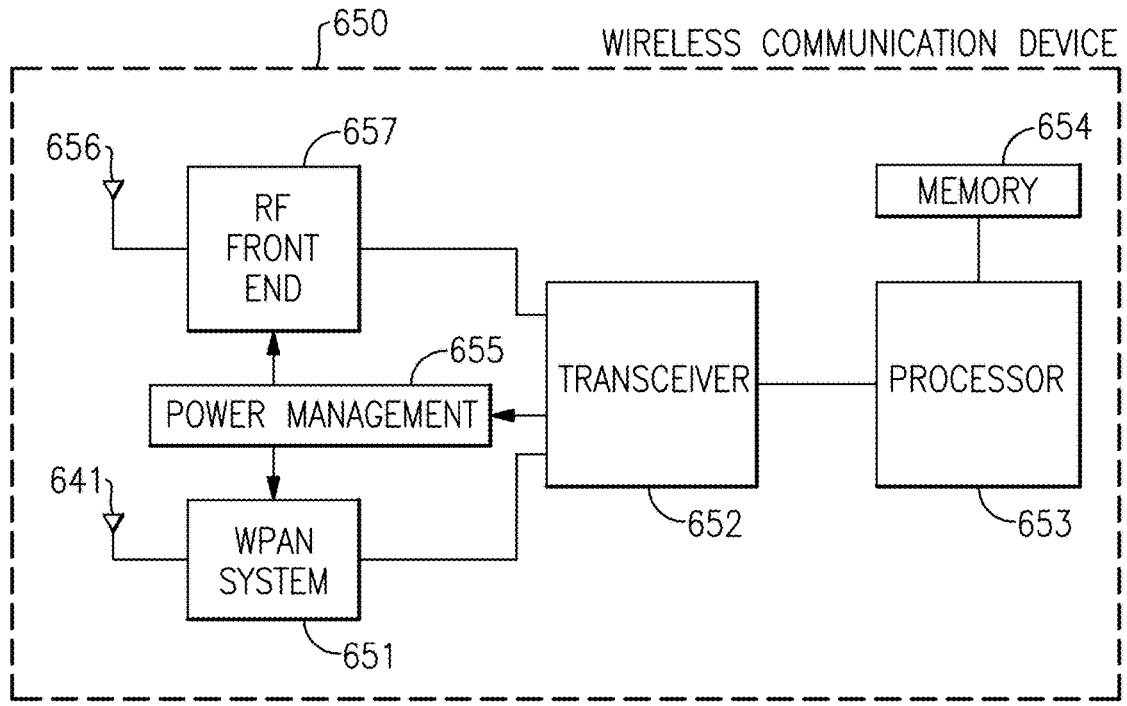
FIG. 9A is a schematic diagram of a wireless communication device according to one embodiment.
Figure 9B:
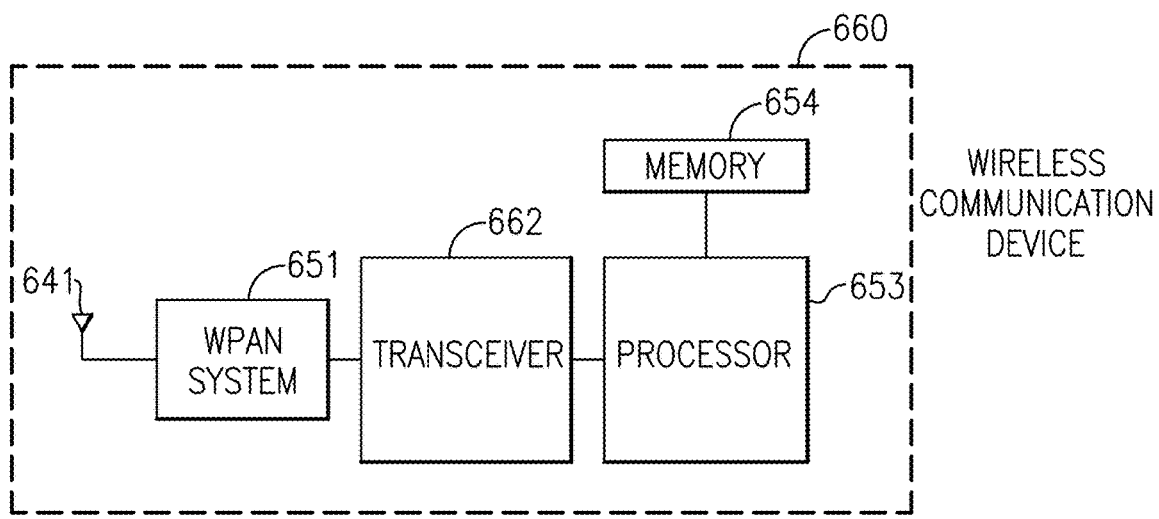
FIG. 9B is a schematic diagram of a wireless communication device according to another embodiment.

FIGS. 9A and 9B are schematic block diagrams of illustrative wireless communication devices that include an RF amplifier and/or a front end system in accordance with one or more embodiments. The wireless communication devices can be any suitable wireless communication device. For instance, this device can be a mobile phone, such as a smart phone.

FIG. 9A is a schematic diagram of a wireless communication device 650 according to one embodiment.

As illustrated, the wireless communication device 650 includes a first antenna 641, a wireless personal area network (WPAN) system 651, a transceiver 652, a processor 653, a memory 654, a power management block 655, a second antenna 656, and an RF front end system 657. Any of the overload protection schemes discussed herein can be implemented in the WPAN system 651 and/or the RF front end system 657. The WPAN system 651 is an RF front end system configured for processing RF signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

FIG. 9B is a schematic diagram of a wireless communication device 660 according to another embodiment.

The illustrated wireless communication device 660 of FIG. 9B is a device configured to communicate over a PAN. This wireless communication device can be relatively less complex than the wireless communication device 650 of FIG. 9A. As illustrated, the wireless communication device 660 includes an antenna 641, a WPAN system 651, a transceiver 662, a processor 653, and a memory 654. The WPAN system 660 can include an RF amplifier with an overload detection circuit in accordance with any of the principles and advantages discussed herein.

Figure 9C:
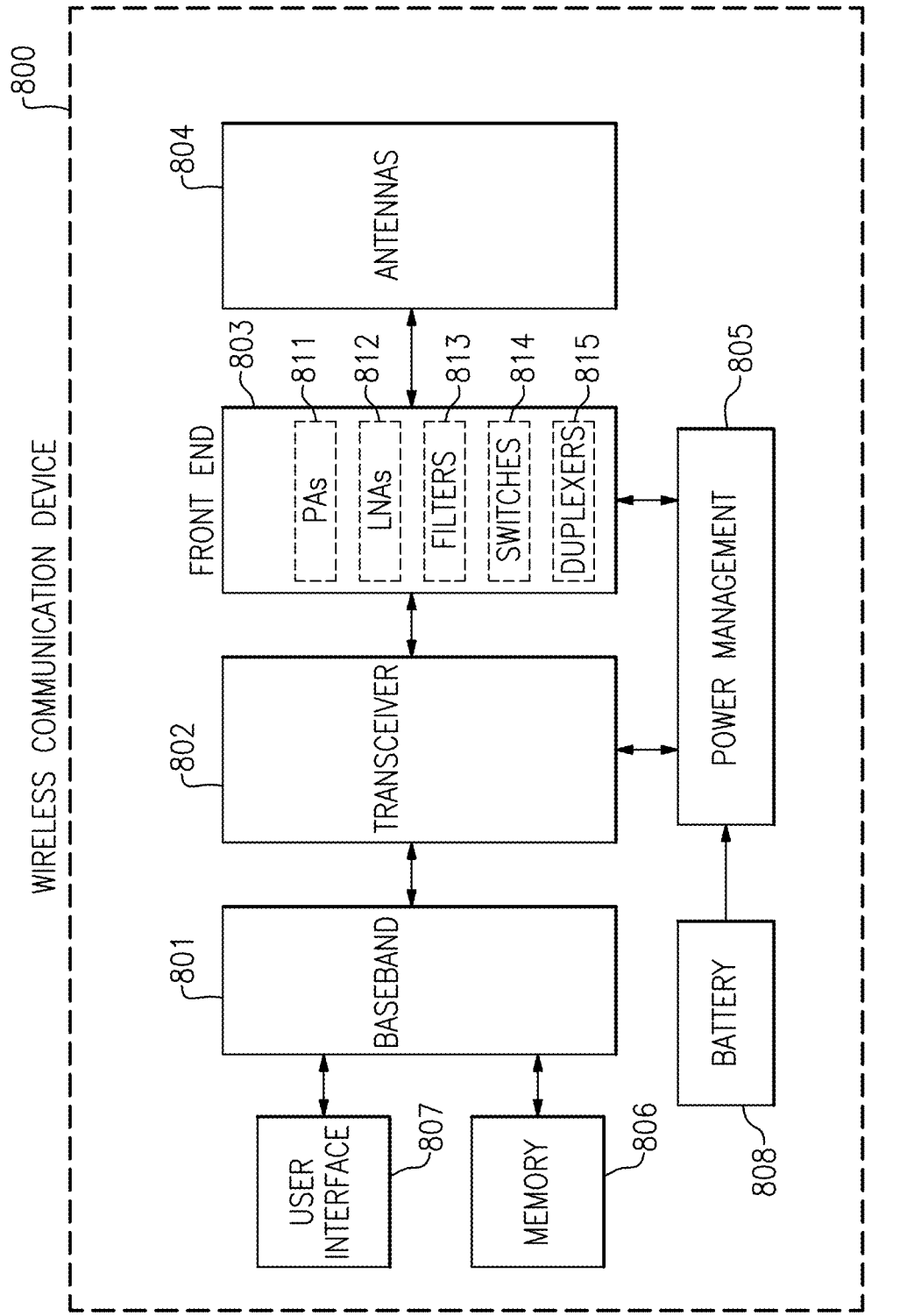
FIG. 9C is a schematic diagram of another example of a wireless communication device.

FIG. 9C is a schematic diagram of another example of a wireless communication device 800. The wireless communication device 800 includes a baseband system 801, a transceiver 802, a front-end system 803, one or more antennas 804, a power management system 805, a memory 806, a user interface 807, and a battery 808.

The wireless communication device 800 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMAX), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9C as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes one or more power amplifiers (PAs) 811, one or more low noise amplifiers (LNAs) 812, one or more filters 813, one or more switches 814, and one or more duplexers 815. However, other implementations are possible.

For example, the front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

Any of the suitable combination of features disclosed herein can be implemented in the wireless communication device 800. For example, the front end system 803 can be implemented using any of the features described above and/or in the sections below.

In certain implementations, the wireless communication device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 800 can operate with beamforming in certain implementations. For example, the front-end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9C, the baseband system 801 is coupled to the memory 806 of facilitate operation of the wireless communication device 800.

The memory 806 can be used for a wide variety of purposes, such as storing data and/or instructions to facilitate the operation of the wireless communication device 800 and/or to provide storage of user information.

The power management system 805 provides a number of power management functions of the wireless communication device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9C, the power management system 805 receives a battery voltage from the battery 808. The battery 808 can be any suitable battery for use in the wireless communication device 800, including, for example, a lithium-ion battery.

One example application of the RF amplifiers herein is to enable various objects with wireless connectivity, such as for Internet of things (IoT). IoT refers to a network of objects or things, such as devices, vehicles, and/or other items that are embedded with electronics that enable the objects to collect and exchange data (for instance, machine to machine communications) and/or to be remotely sensed and/or controlled.

The RF amplifiers herein can be used to enable wireless connectivity of various objects, thereby allowing such objects to communicate in an IoT network. The RF amplifiers discussed herein can be implemented in IoT applications to enable wireless connectivity to expand the way consumers manage information and their environment. Such RF amplifiers can enable the new and emerging IoT applications, which can bring people and things closer to vital information wherever it is desired. Although IoT is one example application of front RF amplifiers herein, the teachings herein are applicable to a wide range of technologies and applications. Some example IoT applications will now be discussed.

IoT devices can be implemented in automotive systems. From telematics to infotainment systems, lighting, remote keyless entry, collision avoidance platforms, toll transponders, video displays, vehicle tracking tools, and the like, RF amplifiers in accordance with any suitable principles and advantages discussed herein can help enable convenience and safety features for the connected vehicle.

IoT devices can be implemented in connected home environments. RF amplifiers in accordance with any suitable principles and advantages discussed herein can allow homeowners greater control over their home environment. IoT devices can be implemented in a host of devices including smart thermostats, security systems, sensors, light switches, smoke and carbon monoxide alarms, routers, high definition televisions, gaming consoles and much more.

IoT devices can be implemented in industrial contexts. From smart city applications to factory automation, building controls, commercial aircraft, vehicle tracking, smart metering, LED lighting, security cameras, and smart agriculture functions, RF amplifiers in accordance with any suitable principles and advantages discussed herein can enable these applications and meet specifications.

IoT devices can be implemented in machine-to-machine contexts. IoT devices can enable machine-to-machine communications that can transform the way organizations do business. From manufacturing automation to telemetry, remote control devices, and asset management, RF amplifiers discussed herein can provide cellular, short-range, and global positioning solutions that support a wide range of machine-to-machine applications.

IoT devices can be implemented in medical applications. RF amplifiers in accordance with any suitable principles and advantages discussed herein can enable medical devices and the communication of information that is improving the care of millions of people worldwide. RF amplifiers in accordance with any suitable principles and advantages discussed herein can be integrated into product designs that enable the miniaturization of medical devices and enhance data transmission. RF amplifiers, such as power amplifiers, in accordance with any suitable principles and advantages discussed herein can be implemented in medical instruments.

IoT devices can be implemented in mobile devices. The communication landscape has changed in recent years as consumers increasingly seek to be connected everywhere and all the time. RF amplifiers in accordance with any suitable principles and advantages discussed herein can be compact, energy and cost efficient, meeting size and performance constraints, while enabling a great consumer experience. Wireless mobile devices, such as smartphones, tablets and WLAN systems, can include one or more RF amplifiers in accordance with any suitable principles and advantages discussed herein.

IoT devices can be implemented in smart energy applications. Utility companies are modernizing their systems using computer-based remote control and automation that involves two-way communication. Some benefits to utilities and consumers include optimized energy efficiency, leveling and load balancing on the smart grid. RF amplifiers in accordance with any suitable principles and advantages discussed herein can be implemented in smart meters, smart thermostats, in-home displays, ZigBee/802.15.4, Bluetooth, and Bluetooth low energy applications.

IoT devices can be implemented in wearable devices. Wearable devices, such as smartwatches, smart eyewear, fitness trackers and health monitors, can include RF amplifiers in accordance with any suitable principles and advantages discussed herein to enable relatively small form factor solutions that consume relatively low power and enable always on connectivity. This can allow applications to run in the background for lengthy periods of time without a battery recharge, for example.

Any suitable principles and advantages discussed herein can implemented in an IoT network, IoT object, a vehicle, industrial equipment, a corresponding front end system, a corresponding circuit board, the like, or any suitable combination thereof. Some examples will now be discussed.

Figure 10:
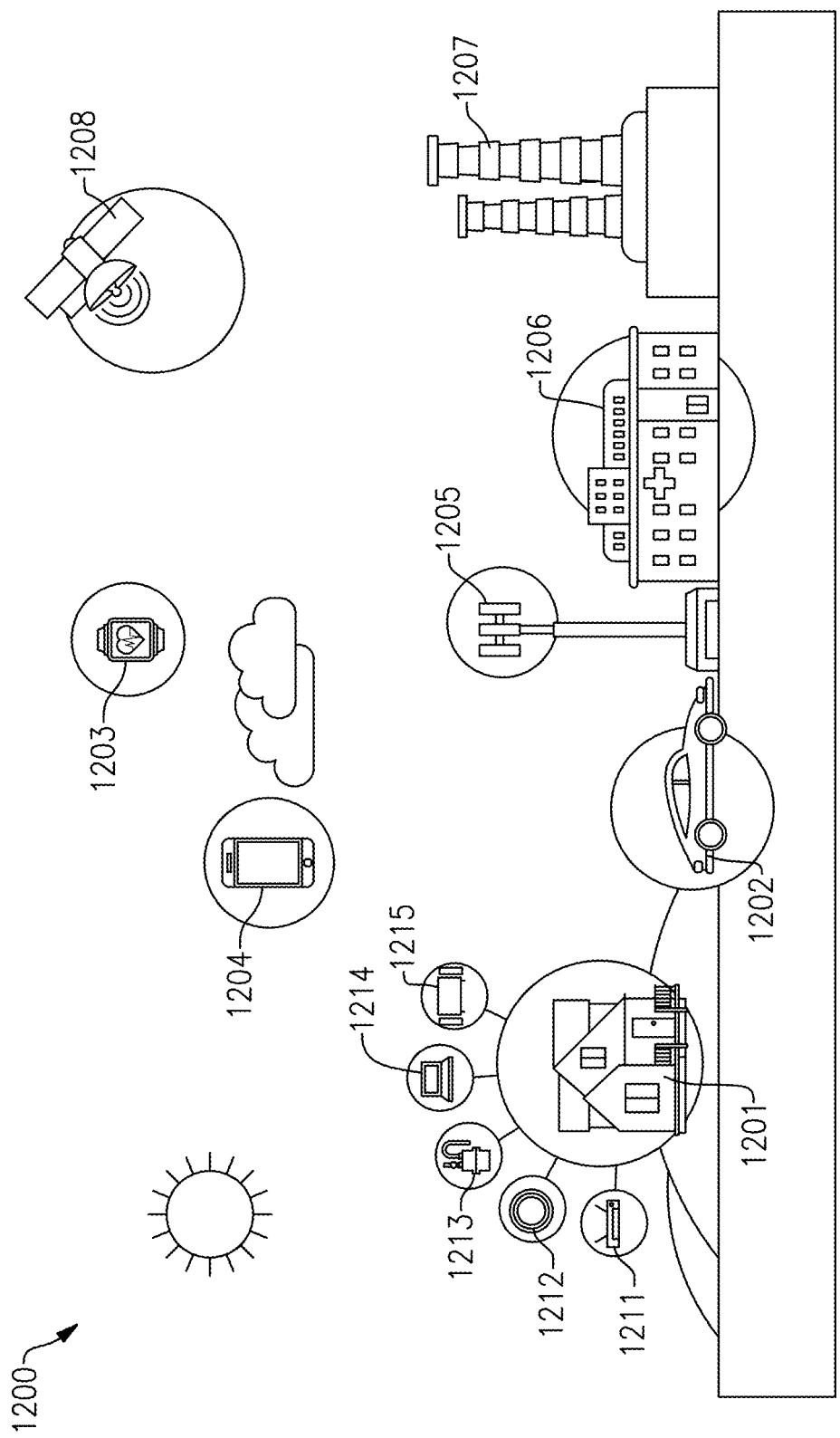
FIG. 10 is a schematic diagram of one example of an Internet of things (IoT) network.

FIG. 10 is a schematic diagram of one example of an IoT network 1200. The IoT network 1200 includes a smart home 1201, a smart vehicle 1202, a wearable 1203, a mobile device 1204, a base station 1205, a smart hospital 1206, a smart factory 1207, and a smart satellite 1208. One or more of the IoT-enabled objects of FIG. 10 can include a front end system, such as a front end module and/or front-end integrated circuit, implemented in accordance with the teachings herein.

The smart home 1201 is depicted as including a wide variety of IoT-enabled objects, including an IoT-enabled router 1211, an IoT-enabled thermostat 1212, an IoT-enabled meter 1213, IoT-enabled laptop 1214, and an IoT-enabled television 1215. Although various examples of IoT-enable objects for a smart home are shown, a smart home can include a wide variety of IoT-enabled objects. Examples of such IoT-enabled objects include, but are not limited to, an IoT-enabled computer, an IoT-enabled laptop, an IoT-enabled tablet, an IoT-enabled computer monitor, an IoT-enabled television, an IoT-enabled media system, an IoT-enabled gaming system, an IoT-enabled camcorder, an IoT-enabled camera, an IoT-enabled modem, an IoT-enabled router, an IoT-enabled kitchen appliance, an IoT-enabled telephone, an IoT-enabled air conditioner, an IoT-enabled washer, an IoT-enabled dryer, an IoT-enabled copier, an IoT-enabled facsimile machine, an IoT-enabled scanner, an IoT-enabled printer, an IoT-enabled scale, an IoT-enabled home assistant (for instance, a voice-controlled assistant device), an IoT-enabled security system, an IoT-enabled thermostat, an IoT-enabled smoke detector, an IoT-enabled garage door, an IoT-enabled lock, an IoT-enabled sprinkler, an IoT-enabled water heater, and/or an IoT-enabled light.

As shown in FIG. 10, the smart vehicle 1202 also operates in the IoT network 1200. The smart vehicle 1202 can include a wide variety of IoT-enabled objects, including, but not limited to, an IoT-enabled infotainment system, an IoT-enabled lighting system, an IoT-enabled temperature control system, an IoT-enabled lock, an IoT-enabled ignition, an IoT-enabled collision avoidance system, an IoT-enabled toll transponder, and/or an IoT-enabled vehicle tracking system. In certain implementations, the smart vehicle 1202 can communicate with other smart vehicles to thereby provide vehicle-to-vehicle (V2V) communications. Furthermore, in certain implementations the smart vehicle 1202 can operate using vehicle-to-everything (V2X) communications, thereby communicating with traffic lights, toll gates, and/or other IoT-enabled objects.

The wearable 1203 of FIG. 10 is also IoT-enabled. Examples of IoT-enabled wearables include, but are not limited to, an IoT-enabled watch, an IoT-enabled eyewear, an IoT-enabled fitness tracker, and/or an IoT-enabled biometric device.

The IoT network 1200 also includes the mobile device 1204 and base station 1205. Thus, in certain implementations user equipment (UE) and/or base stations of a cellular network can operate in an IoT network and be IoT-enabled. Furthermore, a wide variety of IoT-enabled objects can communication using existing network infrastructure, such as cellular infrastructure.

With continuing reference to FIG. 10, IoT is not only applicable to consumer devices and objects, but also to other applications, such as medical, commercial, industrial, aerospace, and/or defense applications. For example, the smart hospital 1206 can include a wide variety of IoT-enabled medical equipment and/or the smart factory 1207 can include a wide variety of IoT-enabled industrial equipment. Furthermore, airplanes, satellites, and/or aerospace equipment can also be connected to an IoT network. Other examples of IoT applications include, but are not limited to, asset tracking, fleet management, digital signage, smart vending, environmental monitoring, city infrastructure (for instance, smart street lighting), toll collection, and/or point-of-sale.

Although various examples of IoT-enabled objects are illustrated in FIG. 10, an IoT network can include a wide variety of types of objects. Furthermore, any number of such objects can be present in an IoT network. For instance, an IoT network can include millions or billions of IoT-enable objects or things.

IoT-enabled objects can communicate using a wide variety of communication technologies, including, but not limited to, Bluetooth, ZigBee, Z-Wave, 6LowPAN, Thread, Wi-Fi, NFC, Sigfox, Neul, and/or LoRaWAN technologies. Furthermore, certain IoT-enabled objects can communicate using cellular infrastructure, for instance, using 2G, 3G, 4G (including LTE, LTE-Advanced, and/or LTE-Advanced Pro), and/or 5G technologies.

Figure 11A:
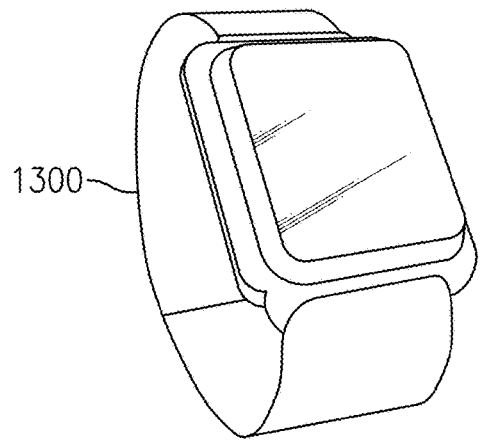
FIG. 11A is a schematic diagram of one example of an IoT-enabled watch.

FIG. 11A is a schematic diagram of one example of an IoT-enabled watch 1300. The IoT-enabled watch 1300 illustrates one example of a smart wearable that can include one or more RF amplifiers implemented in accordance with one or more features disclosed herein.

Figure 11B:
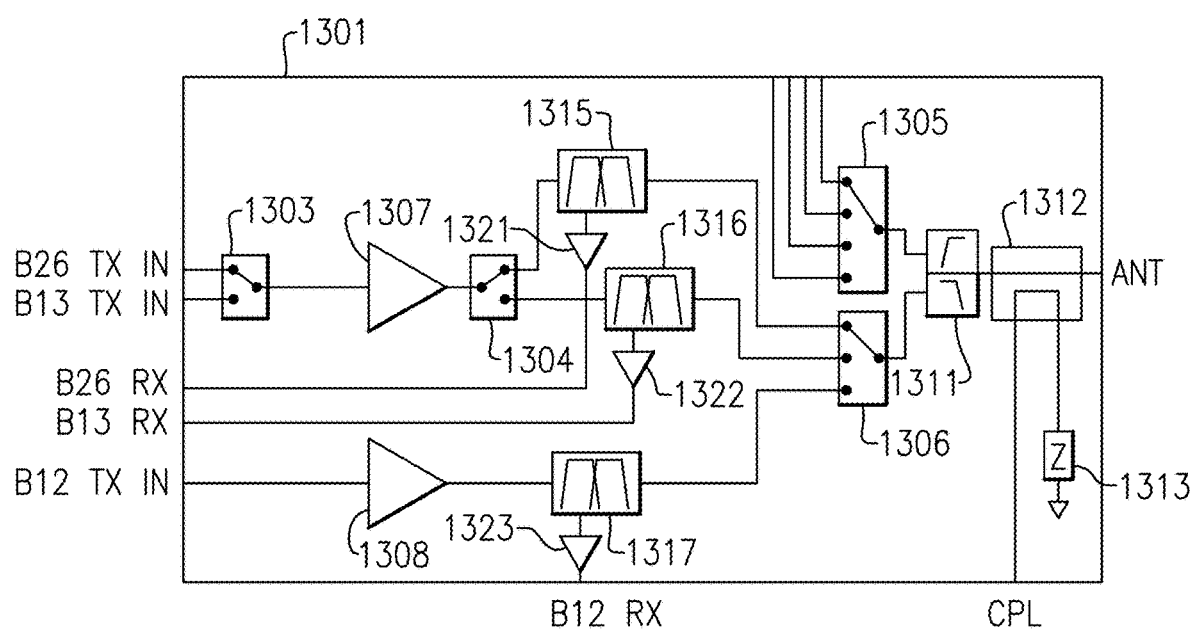
FIG. 11B is a schematic diagram of one example of a front end system for an IoT-enabled object.

FIG. 11B is a schematic diagram of one example of a front end system 1301 for an IoT-enabled object, such as the IoT-enabled watch 1300 of FIG. 11A. The front end system 1301 includes a first transceiver-side switch 1303, a second transceiver-side switch 1304, a first antenna-side switch 1305, a second antenna-side switch 1306, a first power amplifier 1307, a second power amplifier 1308, a duplexer 1311, a directional coupler 1312, a termination impedance 1313, a first band selection filter 1315, a second band selection filter 1316, a third band selection filter 1317, a first LNA 1321, a second LNA 1322, and a third LNA 1323.

In the illustrated embodiment, the first transceiver-side switch 1303 selects between a Band 26 transmit input pin (B26 TX IN) and a Band 13 transmit input pin (B13 TX IN). The second transceiver-side switch 1303 controls connection of the output of the first power amplifier 1307 to the first band selection filter 1315 or the first band selection filter 1316. Thus, the first power amplifier 1307 selectively amplifies Band 26 or Band 13, in this example. Additionally, the second power amplifier 1308 amplifies a Band 12 transmit input pin (B12 TX IN). After suitable filtering by the band selection filters 1315-1317, the second antenna-side switch 1306 selects a desired transmit signal for providing to an antenna pin (ANT) via the duplexer 1311 and the directional coupler 1312. As shown in FIG. 11B, the directional coupler 1312 is terminated by the termination impedance 1313. Additionally, the first antenna-side switch 1305 provides a signal received on the antenna pin (ANT) to a desired receive output pin (four in this example) of the front end system 1301. The illustrated front end system 1301 also includes various additional pins to provide additional functionality, such as enhanced monitoring of transmit power. For instance, front end system 1301 includes a directional coupler output pin (CPL), and feedback pins (B12 RX, B13 RX, and B26 RX) for providing feedback signals associated with transmit signals (for Band 12, Band 13, and Band 26, respectively) generated by the power amplifiers. Each feedback pin includes an LNA, in this example.

The front end system 1301 can incorporate one or more features described in the sections herein.

Figure 12A:
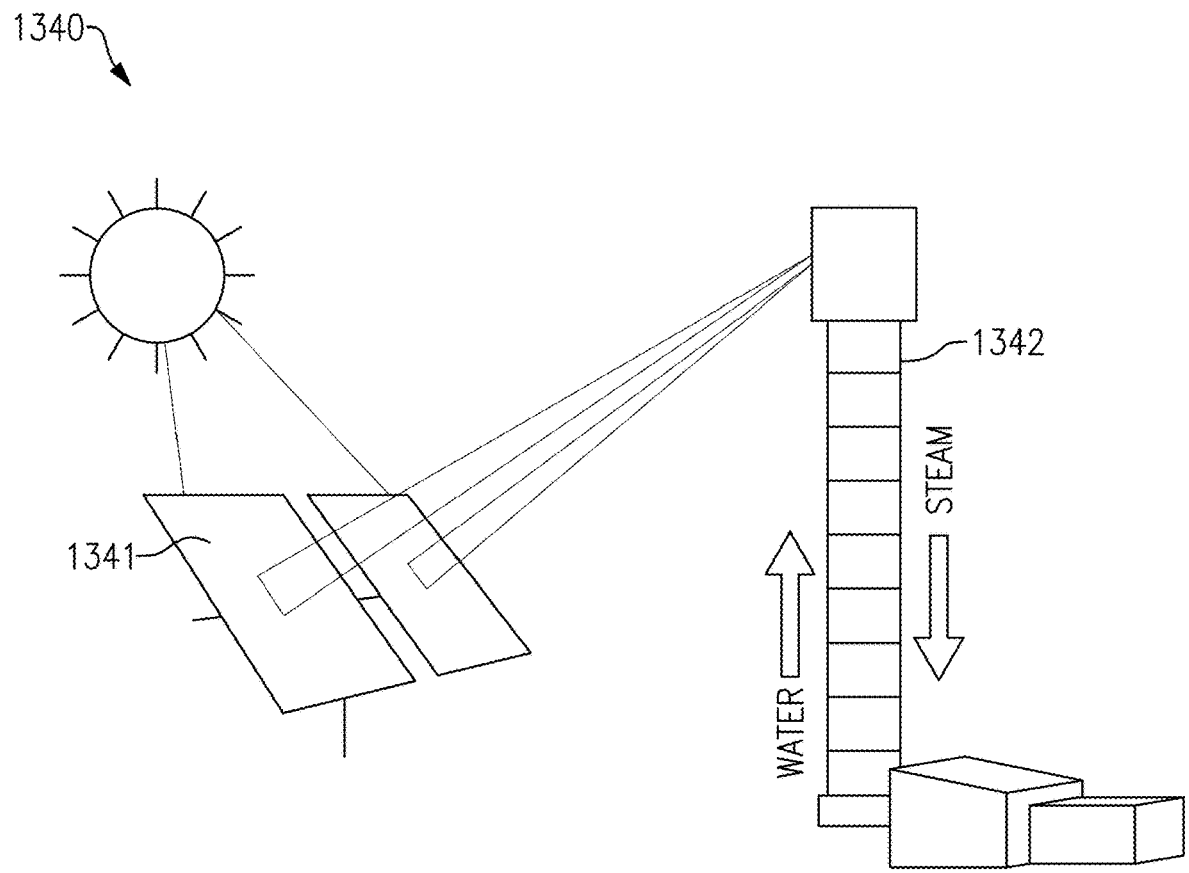
FIG. 12A is a schematic diagram of one example of IoT-enabled industrial equipment.

FIG. 12A is a schematic diagram of one example of IoT-enabled industrial equipment 1340. In the illustrated embodiment, the IoT-enabled industrial equipment 1340 includes heliostats 1341 for reflecting light to a solar receiver and turbine 1342. The IoT-enabled industrial equipment 1340 can include one or more front end systems for a variety of purposes, such as providing angular positional control of the heliostats 1341 to control concentration of solar energy directed toward the solar receiver and turbine 1342. The IoT-enabled industrial equipment 1340 can include a front end system implemented in accordance with one or more features disclosed herein.

Figure 12B:
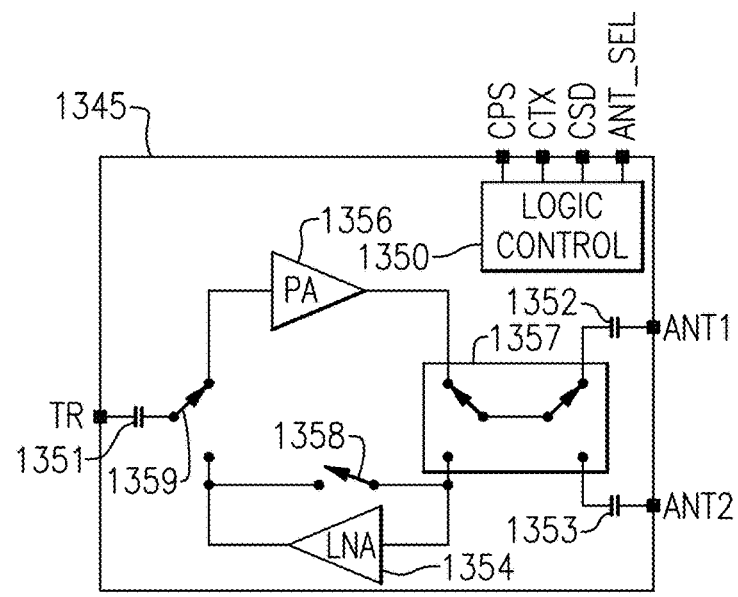
FIG. 12B is a schematic diagram of another example of a front end system for an IoT-enabled object.

FIG. 12B is a schematic diagram of another example of a front end system 1345 for an IoT-enabled object, such as the IoT-enabled industrial equipment 1340 of FIG. 12A.

The front end system 1345 includes a logic control circuit 1350, a transceiver DC blocking capacitor 1351, a first antenna DC blocking capacitor 1352, a second antenna DC blocking capacitor 1353, an LNA 1354, a power amplifier 1356, an antenna-side switch 1357, a bypass switch 1358, and a transceiver-side switch 1359.

The front end system 1345 includes control pins (CPS, CTX, CSD, ANT_SEL) for controlling the front end system 1345. The antenna-side switch 1357 selectively connects either a first antenna pin (ANT1) or a second antenna pin (ANT2) to either an output of the power amplifier 1356 or the bypass switch 1358/input to the LNA 1354. Additionally, the bypass switch 1358 selectively bypasses the LNA 1354. Furthermore, the transceiver-side switch 1359 selectively connected the transceiver pin (TR) to either an input of the power amplifier 1356 or the bypass switch 1358/output to the LNA 1354. The DC blocking capacitors 1351-1353 serve to provide DC blocking to provide enhanced flexibility in controlling internal DC biasing of the front end system 1345.

The front end system 1345 can incorporate one or more features described in the sections herein.

Figure 13A:
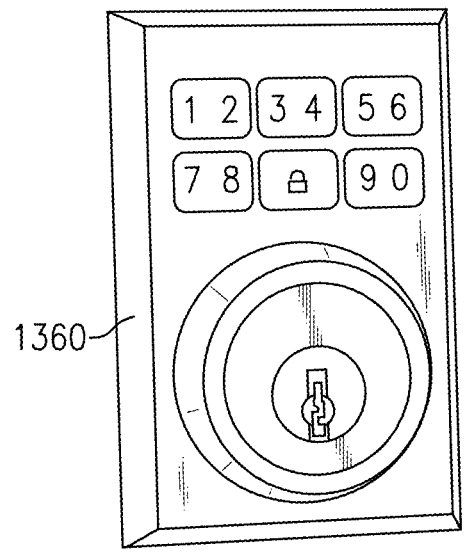
FIG. 13A is a schematic diagram of one example of an IoT-enabled lock.

FIG. 13A is a schematic diagram of one example of an IoT-enabled lock 1360. The IoT-enabled lock 1360 illustrates one example of an IoT-enabled object that can include a front end system implemented in accordance with one or more features disclosed herein.

Figure 13B:
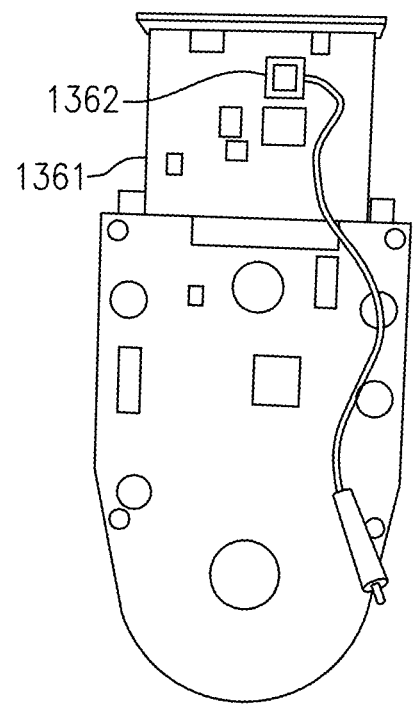
FIG. 13B is a schematic diagram of one example of a circuit board for the IoT-enabled lock of FIG. 13A.

FIG. 13B is a schematic diagram of one example of a circuit board 1361 for the IoT-enabled lock 1360 of FIG. 13A. The circuit board 1361 includes a front end system 1362, which can incorporate one or more features described in the sections herein.

Figure 14A:
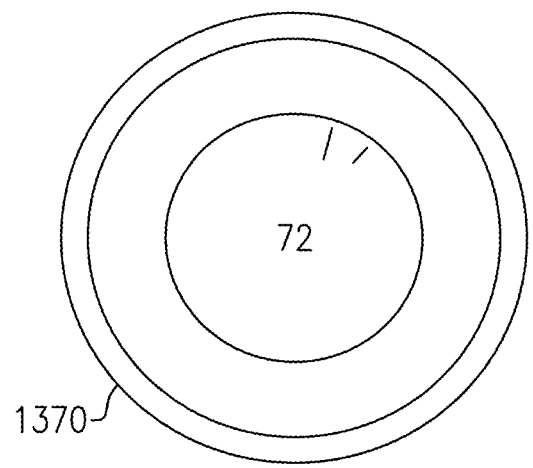
FIG. 14A is a schematic diagram of one example of an IoT-enabled thermostat.

FIG. 14A is a schematic diagram of one example of IoT-enabled thermostat 1370. The IoT-enabled thermostat 1370 illustrates another example of an IoT-enabled object that can include a front end system implemented in accordance with one or more features disclosed herein.

Figure 14B:
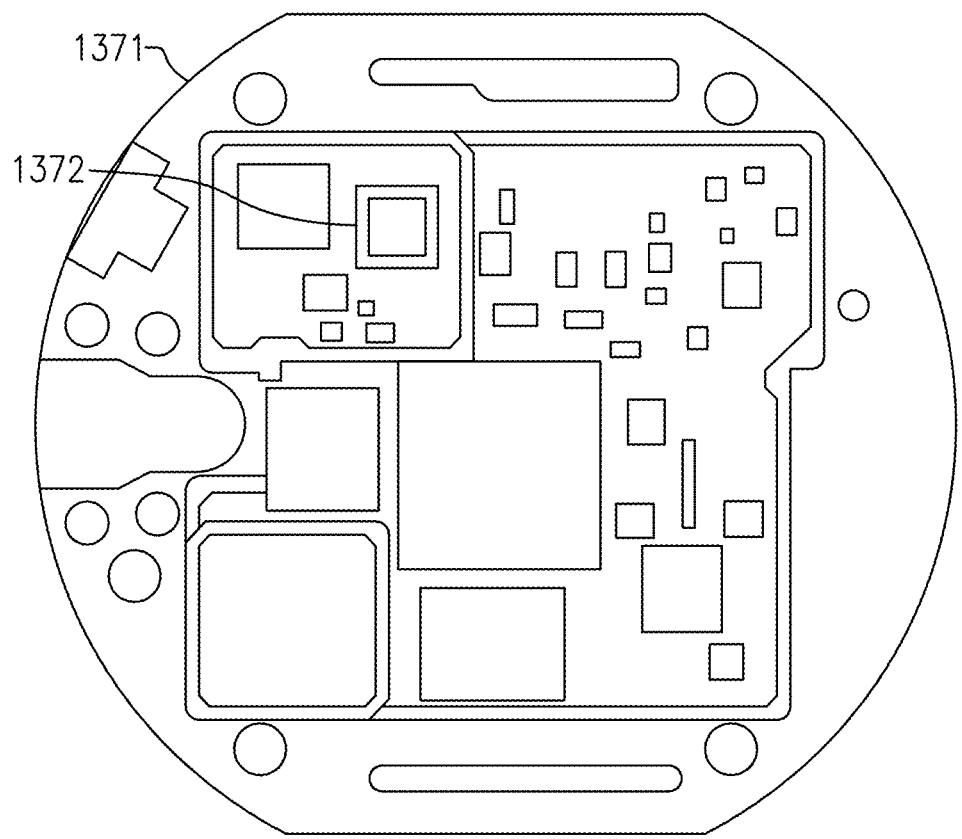
FIG. 14B is a schematic diagram of one example of a circuit board for the IoT-enabled thermostat of FIG. 14A.

FIG. 14B is a schematic diagram of one example of a circuit board 1371 for the IoT-enabled thermostat 1370 of FIG. 14A. The circuit board 1371 includes a front end system 1372, which can incorporate one or more features described in the sections herein.

Figure 15A:
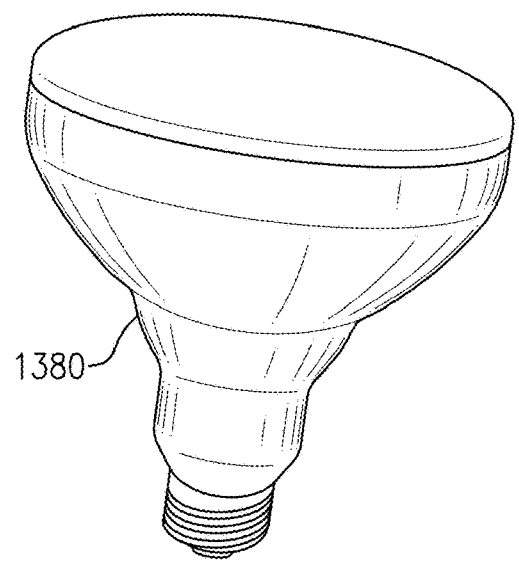
FIG. 15A is a schematic diagram of one example of IoT-enabled light.

FIG. 15A is a schematic diagram of one example of IoT-enabled light 1380. The IoT-enabled light 1380 illustrates another example of an IoT-enabled object that can include a front end system implemented in accordance with one or more features disclosed herein.

Figure 15B:
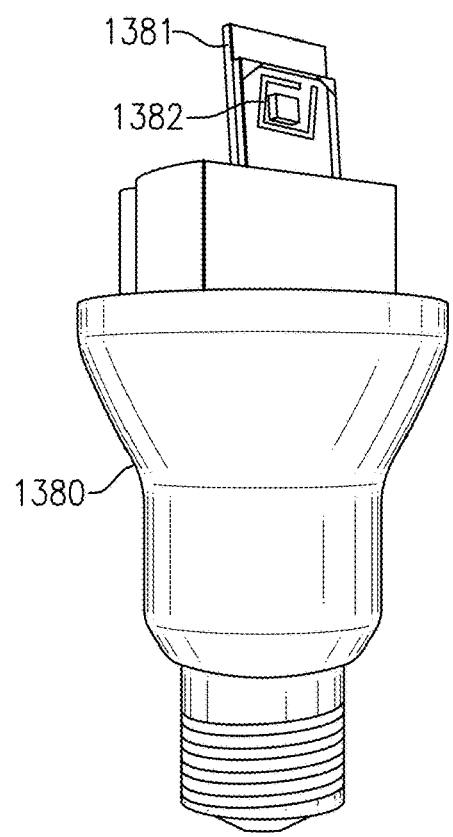
FIG. 15B is a schematic diagram of one example of a circuit board for the IoT-enabled light of FIG. 15A.

FIG. 15B is a schematic diagram of one example of a circuit board 1381 for the IoT-enabled light 1380 of FIG. 15A. FIG. 15B also depicts a base portion of the IoT-enabled light 1380 for housing the circuit board 1381. The circuit board 1381 includes a front end system 1382, which can incorporate one or more features described in the sections herein.

Although FIGS. 7A-15B illustrate examples of electronic systems that can include an RF amplifier implemented in accordance with the teachings herein, RF amplifier can be used in other configurations of electronics.

Applications

Some of the embodiments described above have provided examples in connection with low noise amplifiers, front end modules and/or wireless communications devices. However, the principles and advantages of the embodiments can be used for any other systems or apparatus that benefit from any of the circuits described herein.

For example, RF amplifiers can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
an antenna configured to receive a radio frequency signal;
a front-end system configured to generate a radio frequency receive signal based on processing the radio frequency signal, the front-end system including a low noise amplifier including a field effect transistor configured to amplify the radio frequency signal, a switch, a degeneration inductor in series with the switch between a source of the field effect transistor and a ground voltage, and an overload detection circuit configured to control an impedance of the switch based on a detected input signal level to the low noise amplifier; and
a transceiver configured to downconvert the radio frequency receive signal.

2. The mobile device of claim 1 further comprising an electrostatic discharge protection circuit electrically connected between a gate of the field effect transistor and the ground voltage, the overload detection circuit configured to control the impedance of the switch based on an internal signal level of the electrostatic discharge protection circuit.

3. The mobile device of claim 2 wherein the electrostatic discharge protection circuit includes a plurality of diodes in series between the gate of the field effect transistor and the ground voltage, the overload detection circuit configured to receive an input voltage corresponding to a voltage across one or more of the plurality of diodes.

4. The mobile device of claim 2 wherein the overload detection circuit includes an input configured to receive the internal signal level of the electrostatic discharge protection circuit and an output configured to provide a detection signal that controls the impedance of the switch.

5. The mobile device of claim 4 wherein the overload detection circuit includes a first diode and a first detection field effect transistor in series, the input of the overload detection circuit connected to a source of the first detection field effect transistor and the output of the overload detection circuit connected to an anode of the first diode.

6. The mobile device of claim 5 wherein the overload detection circuit further includes a second diode coupled between a gate of the first detection field effect transistor and a drain of the first detection field effect transistor.

7. The mobile device of claim 5 wherein the overload detection circuit further includes a second detection field effect transistor having a source connected to a supply voltage and a drain connected to the output.

8. The mobile device of claim 4 wherein the front-end system further includes a buffer including an input that receives a low noise amplifier enable signal and an output that controls the switch, the detection signal operable to supply power to the buffer.

9. The mobile device of claim 1 further comprising a baseband processor configured to receive a downconverted signal from the transceiver.

10. A method of signal amplification in a mobile device, the method comprising:
receiving a radio frequency signal at an antenna;
processing the radio frequency signal to generate a radio frequency receive signal, including amplifying the radio frequency signal using a field effect transistor of a low noise amplifier, detecting an input signal level to the low noise amplifier using an overload detection circuit, and controlling a switch of the low noise amplifier based on the detected input signal level, the switch in series with a degeneration inductor of the low noise amplifier between a source of the field effect transistor and a ground voltage; and
downconverting the radio frequency receive signal using a transceiver.

11. The method of claim 10 further comprising protecting a gate of the field effect transistor using an electrostatic discharge protection circuit, and controlling an impedance of the switch with the overload detection circuit based on an internal signal level of the electrostatic discharge protection circuit.

12. The method of claim 10 further comprising receiving the internal signal level of the electrostatic discharge protection circuit at an input to the overload detection circuit, providing a detection signal at an output of the overload detection circuit, and controlling an impedance of the switch using the detection signal.

13. The method of claim 12 further comprising controlling the switch based on a low noise amplifier enable signal using a buffer, and supplying power to the buffer using the detection signal.

14. A front end module comprising:
an input terminal configured to receive a radio frequency signal;
an output terminal configured to provide a radio frequency receive signal;
a module substrate; and
a semiconductor die attached to the module substrate and configured to generate the radio frequency receive signal based on processing the radio frequency signal, the semiconductor die including a low noise amplifier including a field effect transistor configured to amplify the radio frequency signal, a switch, a degeneration inductor in series with the switch between a source of the field effect transistor and a ground voltage, and an overload detection circuit configured to control an impedance of the switch based on a detected input signal level to the low noise amplifier.

15. The front end module of claim 14 wherein the semiconductor die further includes an electrostatic discharge protection circuit electrically connected between a gate of the field effect transistor and the ground voltage, the overload detection circuit configured to control the impedance of the switch based on an internal signal level of the electrostatic discharge protection circuit.

16. The front end module of claim 15 wherein the electrostatic discharge protection circuit includes a plurality of diodes in series between the gate of the field effect transistor and the ground voltage, the overload detection circuit including an input voltage corresponding to a voltage across one or more of the plurality of diodes.

17. The front end module of claim 15 wherein the overload detection circuit includes an input configured to receive the internal signal level of the electrostatic discharge protection circuit and an output configured to provide a detection signal that controls the impedance of the switch.

18. The front end module of claim 17 wherein the overload detection circuit includes a first diode and a first detection field effect transistor in series, the input of the overload detection circuit connected to a source of the first detection field effect transistor and the output of the overload detection circuit connected to an anode of the first diode.

19. The front end module of claim 18 wherein the overload detection circuit further includes a second diode coupled between a gate of the first detection field effect transistor and a drain of the first detection field effect transistor, and a second detection field effect transistor having a source connected to a supply voltage and a drain connected to the output.

20. The front end module of claim 17 wherein the front-end system further includes a buffer including an input that receives a low noise amplifier enable signal and an output that controls the impedance of the switch, the detection signal operable to supply power to the buffer.

* * * * *